(12) United States Patent
Chiang

(10) Patent No.: US 7,535,621 B2
(45) Date of Patent: May 19, 2009

(54) ALUMINUM FLUORIDE FILMS FOR MICROELECTROMECHANICAL SYSTEM APPLICATIONS

(75) Inventor: Chih-Wei Chiang, Hsin-Chu (TW)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 58 days.

(21) Appl. No.: 11/646,059

(22) Filed: Dec. 27, 2006

(65) Prior Publication Data

US 2008/0158645 A1 Jul. 3, 2008

(51) Int. Cl.
G02B 26/00 (2006.01)
H01L 29/00 (2006.01)
H01L 21/00 (2006.01)

(52) U.S. Cl. .................. 359/291; 257/415; 438/38; 359/321

(58) Field of Classification Search .................. 257/415, 257/431; 359/290, 291, 321; 430/313; 438/38
See application file for complete search history.

(56) References Cited

U.S. PATENT DOCUMENTS

| | | | |
|---|---|---|---|
| 3,656,836 A | 4/1972 | de Cremoux et al. |
| 3,955,880 A | 5/1976 | Lierke |
| 4,377,324 A | 3/1983 | Durand et al. |
| 4,403,248 A | 9/1983 | te Velde |
| 4,459,182 A | 7/1984 | te Velde |
| 4,482,213 A | 11/1984 | Piliavin et al. |
| 4,519,676 A | 5/1985 | te Velde |
| 4,786,128 A | 11/1988 | Birnbach |
| 4,790,635 A | 12/1988 | Apsley |
| 4,900,136 A | 2/1990 | Goldburt et al. |
| 4,965,562 A | 10/1990 | Verhulst |
| 5,022,745 A | 6/1991 | Zayhowski et al. |
| 5,044,736 A | 9/1991 | Jaskie et al. |

(Continued)

FOREIGN PATENT DOCUMENTS

CN 157313 5/1991

(Continued)

OTHER PUBLICATIONS

Aratani et al., "Process and Design Considerations for Surface Micromachined Beams for a Tuneable Interferometer Array in Silicon," Proc. IEEE Microelectromechanical Workshop, Fort Lauderdale, FL, pp. 230-235 (Feb. 1993).

Aratani K. et al. "Surface Micromachined Tuneable Interferometer Array," Sensors and Actuators A, Elsevier Sequoia S.A., Lausanne, CH, vol. A43, No. 1/3, May 1, 1994, pp. 17-23.

Chu, et al. "Formation and Microstructures of Anodic Aluminoa Films for Aluminum Sputtered onglass Substrate" Journal of the Electrochemical Society, 149 (7) B321-B327 (2002).

(Continued)

*Primary Examiner*—David N Spector
(74) *Attorney, Agent, or Firm*—Knobbe Martens Olson & Bear LLP

(57) ABSTRACT

A microelectromechanical systems (MEMS) device utilizing an aluminum fluoride layer as an etch stop is disclosed. In one embodiment, a MEMS device includes a first electrode having a first surface; and a second electrode having a second surface facing the first surface and defining a gap therebetween. The second electrode is movable in the gap between a first position and a second position. At least one of the electrodes includes an aluminum fluoride layer facing the other of the electrodes. During fabrication of the MEMS device, a sacrificial layer is formed between the first and second electrodes and is released to define the gap. The aluminum fluoride layer serves as an etch stop to protect the first or second electrode during the release of the sacrificial layer.

40 Claims, 16 Drawing Sheets

U.S. PATENT DOCUMENTS

| | | | |
|---|---|---|---|
| 5,061,049 A | 10/1991 | Hornbeck | |
| 5,075,796 A | 12/1991 | Schildkraut et al. | |
| 5,078,479 A | 1/1992 | Vuilleumier | |
| 5,099,353 A | 3/1992 | Hornbeck | |
| 5,124,834 A | 6/1992 | Cusano et al. | |
| 5,142,405 A | 8/1992 | Hornbeck | |
| 5,168,406 A | 12/1992 | Nelson | |
| 5,172,262 A | 12/1992 | Hornbeck | |
| 5,192,395 A | 3/1993 | Boysel et al. | |
| 5,212,582 A | 5/1993 | Nelson | |
| 5,218,472 A | 6/1993 | Jozefowicz et al. | |
| 5,226,099 A | 7/1993 | Mignardi et al. | |
| 5,231,532 A | 7/1993 | Magel et al. | |
| 5,293,272 A | 3/1994 | Jannson et al. | |
| 5,311,360 A | 5/1994 | Bloom et al. | |
| 5,345,328 A | 9/1994 | Fritz et al. | |
| 5,347,377 A | 9/1994 | Revelli, Jr. et al. | |
| 5,381,232 A | 1/1995 | van Wijk | |
| 5,474,865 A | 12/1995 | Vasudev | |
| 5,488,505 A | 1/1996 | Engle | |
| 5,489,952 A | 2/1996 | Gove et al. | |
| 5,500,761 A | 3/1996 | Goossen et al. | |
| 5,526,688 A | 6/1996 | Boysel et al. | |
| 5,535,047 A | 7/1996 | Hornbeck | |
| 5,552,924 A | 9/1996 | Tregilgas | |
| 5,559,358 A | 9/1996 | Burns et al. | |
| 5,578,976 A | 11/1996 | Yao | |
| 5,597,736 A | 1/1997 | Sampsell | |
| 5,602,671 A | 2/1997 | Hornbeck | |
| 5,608,468 A | 3/1997 | Gove et al. | |
| 5,619,059 A | 4/1997 | Li et al. | |
| 5,619,365 A | 4/1997 | Rhoades et al. | |
| 5,619,366 A | 4/1997 | Rhoads et al. | |
| 5,629,790 A | 5/1997 | Neukermans et al. | |
| 5,638,946 A | 6/1997 | Zavracky | |
| 5,665,997 A | 9/1997 | Weaver et al. | |
| 5,674,757 A | 10/1997 | Kim | |
| 5,710,656 A | 1/1998 | Goosen | |
| 5,737,050 A | 4/1998 | Takahara et al. | |
| 5,739,945 A | 4/1998 | Tayebati | |
| 5,745,281 A | 4/1998 | Yi et al. | |
| 5,771,321 A | 6/1998 | Stern | |
| 5,784,189 A | 7/1998 | Bozler et al. | |
| 5,818,095 A | 10/1998 | Sampsell | |
| 5,822,110 A | 10/1998 | Dabbaj | |
| 5,822,170 A | 10/1998 | Cabuz et al. | |
| 5,824,608 A | 10/1998 | Gotoh et al. | |
| 5,825,528 A | 10/1998 | Goosen | |
| 5,835,256 A | 11/1998 | Huibers | |
| 5,867,302 A | 2/1999 | Fleming et al. | |
| 5,896,796 A | 4/1999 | Chih | |
| 5,914,803 A | 6/1999 | Hwang et al. | |
| 5,920,421 A | 7/1999 | Choi | |
| 5,943,155 A | 8/1999 | Goossen | |
| 5,943,158 A | 8/1999 | Ford et al. | |
| 5,959,763 A | 9/1999 | Bozler et al. | |
| 5,960,269 A * | 9/1999 | Ristow et al. | 438/172 |
| 5,967,163 A | 10/1999 | Pan et al. | |
| 5,972,193 A | 10/1999 | Chou et al. | |
| 5,976,902 A | 11/1999 | Shih | |
| 5,978,127 A | 11/1999 | Berg | |
| 5,986,796 A | 11/1999 | Miles | |
| 6,028,690 A | 2/2000 | Carter et al. | |
| 6,031,653 A | 2/2000 | Wang | |
| 6,040,937 A | 3/2000 | Miles | |
| 6,088,162 A | 7/2000 | Someno | |
| 6,097,145 A | 8/2000 | Kastalsky et al. | |
| 6,099,132 A | 8/2000 | Kaeriyama | |
| 6,137,150 A | 10/2000 | Takeuchi et al. | |
| 6,160,833 A | 12/2000 | Floyd et al. | |
| 6,170,332 B1 | 1/2001 | MacDonald et al. | |
| 6,194,323 B1 | 2/2001 | Downey et al. | |
| 6,201,633 B1 | 3/2001 | Peeters et al. | |
| 6,249,039 B1 | 6/2001 | Harvey et al. | |
| 6,282,010 B1 | 8/2001 | Sulzbach et al. | |
| 6,295,154 B1 | 9/2001 | Laor et al. | |
| 6,323,982 B1 | 11/2001 | Hornbeck | |
| 6,327,071 B1 | 12/2001 | Kimura et al. | |
| 6,333,556 B1 | 12/2001 | Juengling et al. | |
| 6,351,329 B1 | 2/2002 | Greywall | |
| 6,376,787 B1 | 4/2002 | Martin et al. | |
| 6,391,675 B1 | 5/2002 | Ehmke et al. | |
| 6,392,781 B1 | 5/2002 | Kim et al. | |
| 6,407,851 B1 | 6/2002 | Islam et al. | |
| 6,447,126 B1 | 9/2002 | Hornbeck | |
| 6,452,124 B1 | 9/2002 | York et al. | |
| 6,452,465 B1 | 9/2002 | Brown et al. | |
| 6,466,354 B1 | 10/2002 | Gudeman | |
| 6,513,911 B1 | 2/2003 | Ozaki et al. | |
| 6,522,801 B1 | 2/2003 | Aksyuk et al. | |
| 6,537,427 B1 | 3/2003 | Raina et al. | |
| 6,552,840 B2 | 4/2003 | Knipe | |
| 6,574,033 B1 | 6/2003 | Chui et al. | |
| 6,577,785 B1 | 6/2003 | Spahn et al. | |
| 6,600,201 B2 | 7/2003 | Hartwell et al. | |
| 6,602,791 B2 | 8/2003 | Ouellet et al. | |
| 6,608,268 B1 | 8/2003 | Goldsmith | |
| 6,624,944 B1 | 9/2003 | Wallace et al. | |
| 6,625,047 B2 | 9/2003 | Coleman, Jr. | |
| 6,639,724 B2 | 10/2003 | Bower et al. | |
| 6,642,913 B1 | 11/2003 | Kimura et al. | |
| 6,650,455 B2 | 11/2003 | Miles | |
| 6,653,997 B2 | 11/2003 | Van Gorkom et al. | |
| 6,674,562 B1 | 1/2004 | Miles | |
| 6,680,792 B2 | 1/2004 | Miles | |
| 6,710,908 B2 | 3/2004 | Miles et al. | |
| 6,720,267 B1 | 4/2004 | Chen et al. | |
| 6,741,377 B2 | 5/2004 | Miles | |
| 6,747,785 B2 | 6/2004 | Chen et al. | |
| 6,747,800 B1 | 6/2004 | Lin | |
| 6,760,146 B2 | 7/2004 | Ikeda et al. | |
| 6,791,441 B2 | 9/2004 | Pillans et al. | |
| 6,794,119 B2 | 9/2004 | Miles | |
| 6,819,469 B1 | 11/2004 | Koba | |
| 6,844,959 B2 | 1/2005 | Huibers et al. | |
| 6,855,610 B2 | 2/2005 | Tung et al. | |
| 6,859,301 B1 | 2/2005 | Islam et al. | |
| 6,906,847 B2 | 6/2005 | Huibers et al. | |
| 6,912,022 B2 | 6/2005 | Lin et al. | |
| 6,940,631 B2 | 9/2005 | Ishikawa | |
| 6,952,303 B2 | 10/2005 | Lin et al. | |
| 6,958,847 B2 | 10/2005 | Lin | |
| 6,980,350 B2 | 12/2005 | Hung et al. | |
| 6,982,820 B2 | 1/2006 | Tsai | |
| 6,987,432 B2 | 1/2006 | Lutz et al. | |
| 6,995,890 B2 | 2/2006 | Lin | |
| 6,999,225 B2 | 2/2006 | Lin | |
| 6,999,236 B2 | 2/2006 | Lin | |
| 7,006,272 B2 | 2/2006 | Tsai | |
| 7,016,095 B2 | 3/2006 | Lin | |
| 7,016,099 B2 | 3/2006 | Ikeda et al. | |
| 7,027,202 B1 | 4/2006 | Hunter et al. | |
| 7,042,643 B2 | 5/2006 | Miles et al. | |
| 7,078,293 B2 | 7/2006 | Lin et al. | |
| 7,110,158 B2 | 9/2006 | Miles | |
| 7,119,945 B2 | 10/2006 | Cummings et al. | |
| 7,123,216 B1 | 10/2006 | Miles | |
| 7,145,143 B2 * | 12/2006 | Wood et al. | 250/339.04 |
| 7,161,730 B2 | 1/2007 | Floyd | |
| 7,172,915 B2 | 2/2007 | Lin et al. | |
| 7,193,768 B2 | 3/2007 | Lin | |
| 7,233,029 B2 | 6/2007 | Mochizuki | |
| 7,250,315 B2 | 7/2007 | Miles | |
| 2001/0003487 A1 | 6/2001 | Miles | |

| | | |
|---|---|---|
| 2001/0010953 A1 | 8/2001 | Kang et al. |
| 2001/0026951 A1 | 10/2001 | Vergani et al. |
| 2001/0055208 A1 | 12/2001 | Kimura |
| 2002/0031155 A1 | 3/2002 | Tayebati et al. |
| 2002/0036304 A1 | 3/2002 | Ehmke et al. |
| 2002/0055253 A1 | 5/2002 | Rudhard |
| 2002/0058422 A1 | 5/2002 | Jang et al. |
| 2002/0075555 A1 | 6/2002 | Miles |
| 2002/0109899 A1 | 8/2002 | Ohtaka et al. |
| 2002/0110948 A1 | 8/2002 | Huang et al. |
| 2002/0117728 A1 | 8/2002 | Brosnihhan et al. |
| 2002/0131682 A1 | 9/2002 | Nasiri et al. |
| 2002/0135857 A1 | 9/2002 | Fitzpatrick et al. |
| 2002/0168136 A1 | 11/2002 | Atia et al. |
| 2002/0195681 A1 | 12/2002 | Melendez et al. |
| 2003/0007107 A1 | 1/2003 | Chae |
| 2003/0021004 A1 | 1/2003 | Cunningham et al. |
| 2003/0036215 A1 | 2/2003 | Reid |
| 2003/0072070 A1 | 4/2003 | Miles |
| 2003/0073042 A1* | 4/2003 | Cernigliaro et al. ......... 430/321 |
| 2003/0077843 A1 | 4/2003 | Yamauchi et al. |
| 2003/0091072 A1 | 5/2003 | Wang et al. |
| 2003/0102771 A1 | 6/2003 | Akiba et al. |
| 2003/0112096 A1 | 6/2003 | Potter |
| 2003/0118920 A1* | 6/2003 | Johnstone et al. ............. 430/5 |
| 2003/0119221 A1 | 6/2003 | Cunningham et al. |
| 2003/0123126 A1 | 7/2003 | Meyer et al. |
| 2003/0132822 A1 | 7/2003 | Ko et al. |
| 2003/0138213 A1 | 7/2003 | Jiin et al. |
| 2003/0201784 A1 | 10/2003 | Potter |
| 2003/0231373 A1 | 12/2003 | Kowarz et al. |
| 2004/0058531 A1 | 3/2004 | Miles et al. |
| 2004/0058532 A1 | 3/2004 | Miles et al. |
| 2004/0061543 A1 | 4/2004 | Nam et al. |
| 2004/0070813 A1 | 4/2004 | Aubuchon |
| 2004/0080807 A1 | 4/2004 | Chen et al. |
| 2004/0124073 A1 | 7/2004 | Pilans et al. |
| 2004/0125281 A1 | 7/2004 | Lin et al. |
| 2004/0125282 A1 | 7/2004 | Lin et al. |
| 2004/0125536 A1 | 7/2004 | Arney et al. |
| 2004/0136076 A1 | 7/2004 | Tayebati |
| 2004/0150869 A1 | 8/2004 | Kasai |
| 2004/0174583 A1 | 9/2004 | Chen et al. |
| 2004/0175577 A1 | 9/2004 | Lin et al. |
| 2004/0191937 A1 | 9/2004 | Patel et al. |
| 2004/0207497 A1 | 10/2004 | Hsu et al. |
| 2004/0217264 A1* | 11/2004 | Wood et al. ............. 250/214 R |
| 2004/0217919 A1 | 11/2004 | Pichi et al. |
| 2004/0240032 A1 | 12/2004 | Miles |
| 2005/0012577 A1 | 1/2005 | Pillans et al. |
| 2005/0012975 A1 | 1/2005 | George et al. |
| 2005/0024557 A1 | 2/2005 | Lin |
| 2005/0035699 A1 | 2/2005 | Tsai |
| 2005/0046919 A1 | 3/2005 | Taguchi et al. |
| 2005/0046922 A1 | 3/2005 | Lin et al. |
| 2005/0078348 A1 | 4/2005 | Lin |
| 2005/0128565 A1 | 6/2005 | Ljungblad |
| 2005/0249966 A1 | 11/2005 | Tung et al. |
| 2005/0250235 A1 | 11/2005 | Miles et al. |
| 2006/0006138 A1 | 1/2006 | Lin |
| 2006/0018348 A1 | 1/2006 | Przybyla et al. |
| 2006/0024880 A1 | 2/2006 | Chui et al. |
| 2006/0050393 A1 | 3/2006 | Lin et al. |
| 2006/0056001 A1 | 3/2006 | Taguchi et al. |
| 2006/0066511 A1 | 3/2006 | Chui |
| 2006/0066932 A1 | 3/2006 | Chui |
| 2006/0066935 A1 | 3/2006 | Cummings et al. |
| 2006/0067646 A1 | 3/2006 | Chui |
| 2006/0077518 A1 | 4/2006 | Chui et al. |
| 2006/0077528 A1 | 4/2006 | Floyd |
| 2006/0119922 A1 | 6/2006 | Faase et al. |
| 2006/0203325 A1 | 9/2006 | Faase et al. |
| 2006/0209386 A1 | 9/2006 | Sudak et al. |
| 2006/0261330 A1 | 11/2006 | Miles |
| 2007/0019280 A1 | 1/2007 | Sasagawa et al. |
| 2007/0041703 A1 | 2/2007 | Wang |
| 2007/0096300 A1 | 5/2007 | Wang et al. |
| 2007/0103028 A1 | 5/2007 | Lewis et al. |
| 2007/0121205 A1 | 5/2007 | Miles |
| 2007/0170540 A1 | 7/2007 | Chung et al. |
| 2007/0206267 A1 | 9/2007 | Tung et al. |
| 2007/0236774 A1 | 10/2007 | Gousev et al. |
| 2007/0247401 A1 | 10/2007 | Sasagawa et al. |
| 2007/0249079 A1 | 10/2007 | Sasagawa et al. |
| 2008/0217645 A1* | 9/2008 | Saxler et al. ................. 257/101 |

FOREIGN PATENT DOCUMENTS

| | | |
|---|---|---|
| DE | 10228946 | 1/2004 |
| EP | 0 035 299 | 9/1983 |
| EP | 0 667 548 | 8/1995 |
| EP | 1 197 778 | 4/2002 |
| EP | 1 243 550 | 9/2002 |
| EP | 1 452 481 | 9/2004 |
| EP | 1 640 772 A1 | 3/2006 |
| FR | 2824643 | 10/1999 |
| JP | 06-281956 | 10/1994 |
| JP | 07-45550 | 2/1995 |
| JP | 09-036387 | 2/1997 |
| JP | 10-116996 | 5/1998 |
| JP | 11-243214 | 9/1999 |
| JP | 11-263012 | 9/1999 |
| JP | 2000-40831 | 2/2000 |
| JP | 2002-296521 | 10/2002 |
| JP | 2002-341267 | 11/2002 |
| JP | 2003-057571 | 2/2003 |
| JP | 2003-215475 | 7/2003 |
| JP | 2005-051007 | 2/2005 |
| KR | 2002-9270 | 10/1999 |
| WO | WO 97/17628 | 5/1997 |
| WO | WO 2005066596 A1 | 7/2005 |
| WO | WO 2005/124869 | 12/2005 |

OTHER PUBLICATIONS

Crouse, "Self-ordered pore structure of anodized aluminum on silicon and pattern transfer" Applied Physics Letters, vol. 76, No. 1, Jan. 3, 2000. pp. 49-51.

French, P.J. "Development of Surface Micromachining techniques compatable with on-chip electronics" Journal of Micromechanics and Microengineering vol. 6 No. 2, 197-211 XP 002360789 Jun. 1996 IOP Publishing.

Furneaux, et al. "The Formation of Controlled-porosity membranes from Anodically Oxidized Aluminum" Nature vo 337 Jan. 12, 1989, pp. 147-149.

Goossen et al., "Possible Display Applications of the Silicon Mechanical Anti-Reflection Switch," Society for Information Display (1994).

Joannopoulos et al., "Photonic Crystals; Molding the Flow of Light," Princeton University Press (1995).

Kawamura et al., Fabrication of fine metal microstructures packaged in the bonded glass substrates, Proceedings of SPIE, vol. 3893, pp. 486-493, 1999.

Kim et al., "Control of Optical Transmission Through Metals Perforated With Subwavelength Hole Arrays," Optic Letters, vol. 24, No. 4, pp. 256-257, (Feb. 1999).

Magel, "Integrated Optic Devices Using Micromachined Metal Membranes," SPIE vol. 2686, 0-8194-2060-Mar. 1996.

Xactix Xetch X# Specifications, http:—www.xactix.com-Xtech X3specs.htm, Jan. 5, 2005.

Xactix Xetch Product Information.

International Search Report and Written Opinion dated Mar. 28, 2008 in counterpart International Application No. PCT/US2007/025936.

* cited by examiner

|  | +$V_{bias}$ | -$V_{bias}$ |
|---|---|---|
| 0 | Stable | Stable |
| +ΔV | Relax | Actuate |
| −ΔV | Actuate | Relax |

Column Output Signals / Row Output Signals

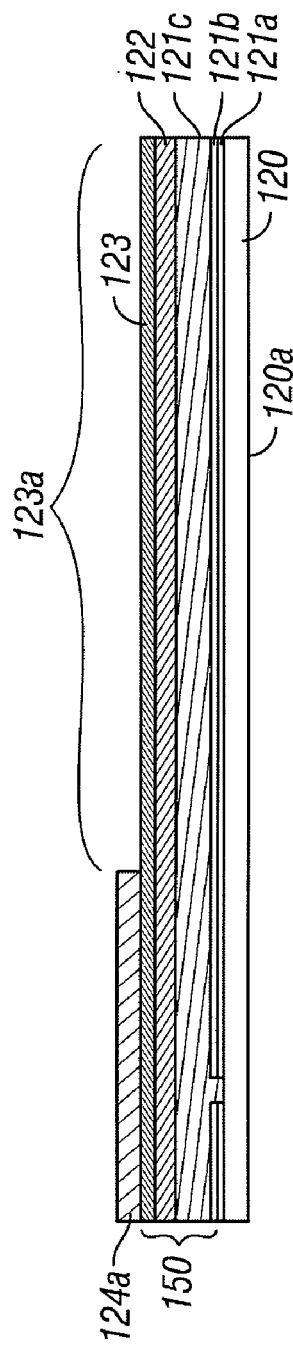
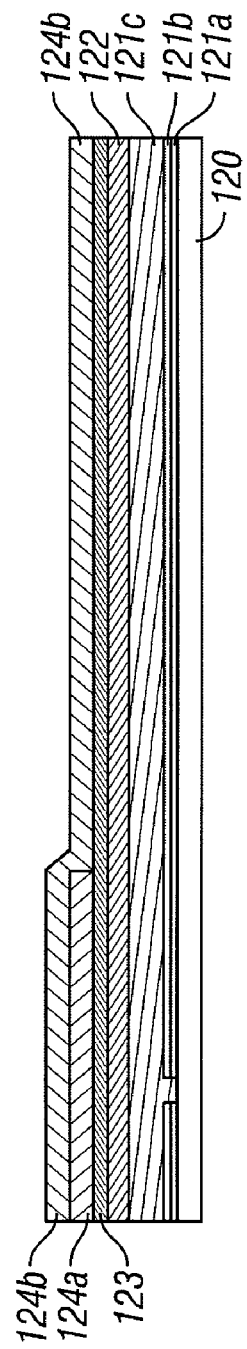
FIG. 12A
FIG. 12B

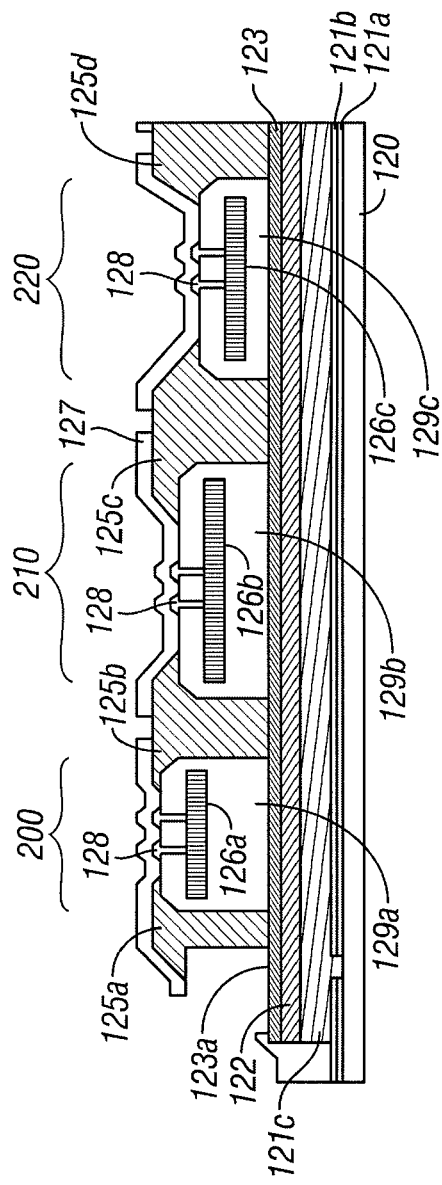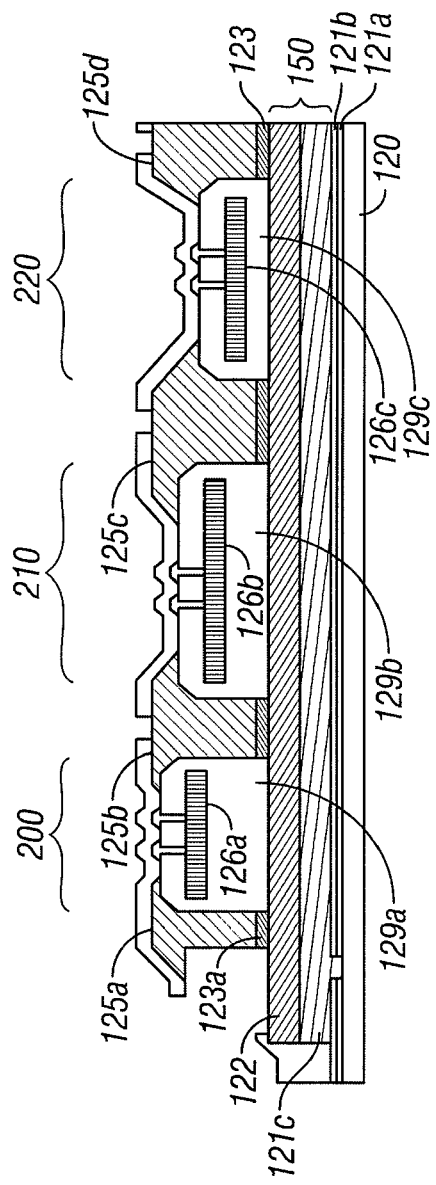

ALUMINUM FLUORIDE FILMS FOR MICROELECTROMECHANICAL SYSTEM APPLICATIONS

BACKGROUND OF THE INVENTION

1. Field of the Invention

This invention relates to microelectromechanical systems devices and methods for making the same.

2. Description of the Related Art

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF THE INVENTION

In one aspect, a microelectromechanical systems (MEMS) device is provided. The MEMS device includes a first electrode having a first surface and a second electrode having a second surface facing the first surface and defining a gap therebetween The second electrode is movable in the gap between a first position and a second position. The first position is a first distance from the first electrode. The second position is a second distance from the first electrode. The second distance is greater than the first distance. At least one of the electrodes comprises an aluminum fluoride layer facing the other of the electrodes.

In another aspect, an interferometric modulator is provided. The interferometric modulator includes transmissive means for at least partially transmitting incident light. The transmissive means has a first surface. The interferometric modulator also includes reflective means for substantially reflecting incident light. The reflective means has a second surface facing the first surface. Moving means is provided for moving the reflective means relative to the transmissive means between a driven position and an undriven position. The driven position is closer to the transmissive means than is the undriven position. At least one of the transmissive and reflective means comprises a layer formed of aluminum fluoride. The layer faces the other of the transmissive and reflective means.

In still another aspect, a method of making a microelectromechanical systems (MEMS) device is provided. The method includes forming a lower electrode. A sacrificial layer is formed over the lower electrode. An upper electrode is formed over the sacrificial layer. An aluminum fluoride layer is formed between forming the lower electrode and forming the upper electrode. The aluminum fluoride layer has a thickness of less than about 200 Å.

BRIEF DESCRIPTION OF THE DRAWINGS

FIGS. 12A-12H are schematic cross sections illustrating a method of making an array of interferometric modulators according to another embodiment.

DETAILED DESCRIPTION OF THE PREFERRED EMBODIMENT

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

In fabricating a MEMS device, a sacrificial layer is formed between a moving electrode and a fixed electrode, and is released to form a cavity or gap therebetween. An etch stop is used to protect the moving or fixed electrodes during the release of the sacrificial layer. In embodiments of the invention, an interferometric modulator, which is an optical MEMS device, employs an aluminum fluoride (AlF$_3$) layer as an etch stop for a moving or fixed electrode. The AlF$_3$ layer may also serve to prevent electrical shorts or to minimize stiction between the moving and fixed electrodes during operation.

Figure 1:
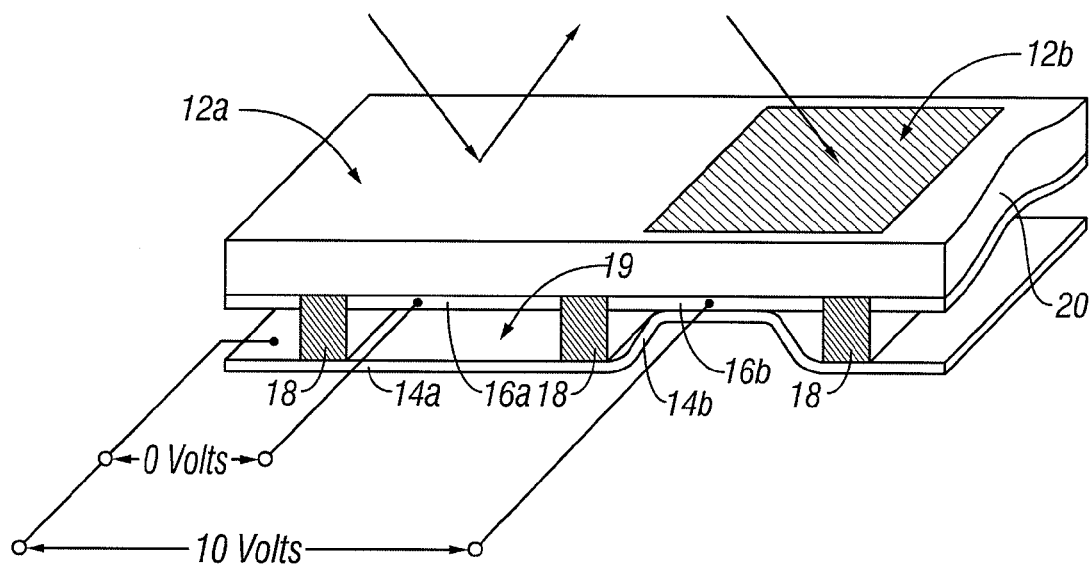
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise of several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. In some embodiments, the layers are patterned into parallel strips, and may form row electrodes in a display device as described further below. The movable reflective layers 14a, 14b may be formed as a series of parallel strips of a deposited metallic layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap or cavity 19. A highly conductive and reflective material such as aluminum may be used for the reflective layers 14, and these strips may form column electrodes in a display device.

With no applied voltage, the cavity 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5 illustrate one exemplary process and system for using an array of interferometric modulators in a display application.

Figure 2:
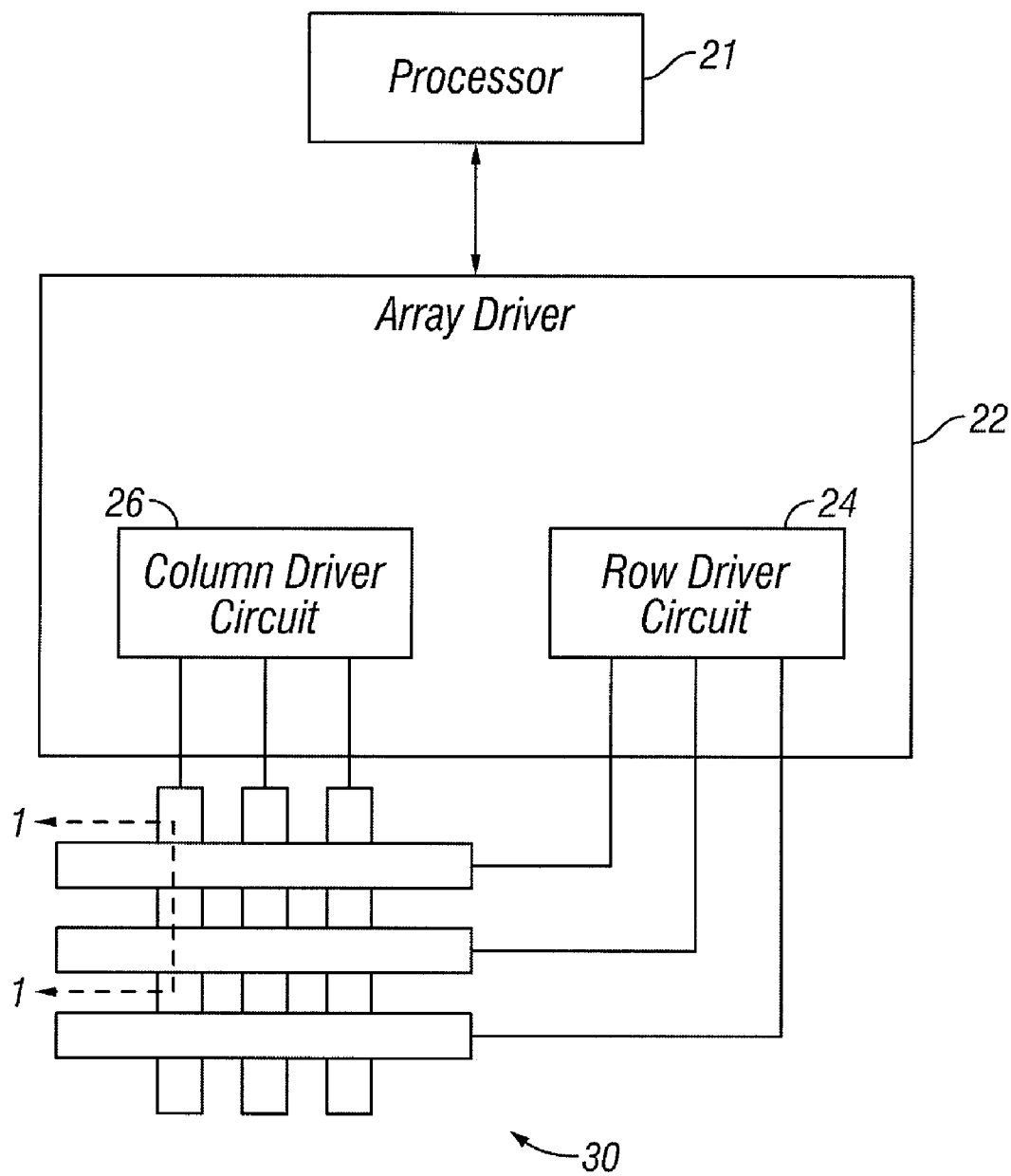
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a panel or display array (display) 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
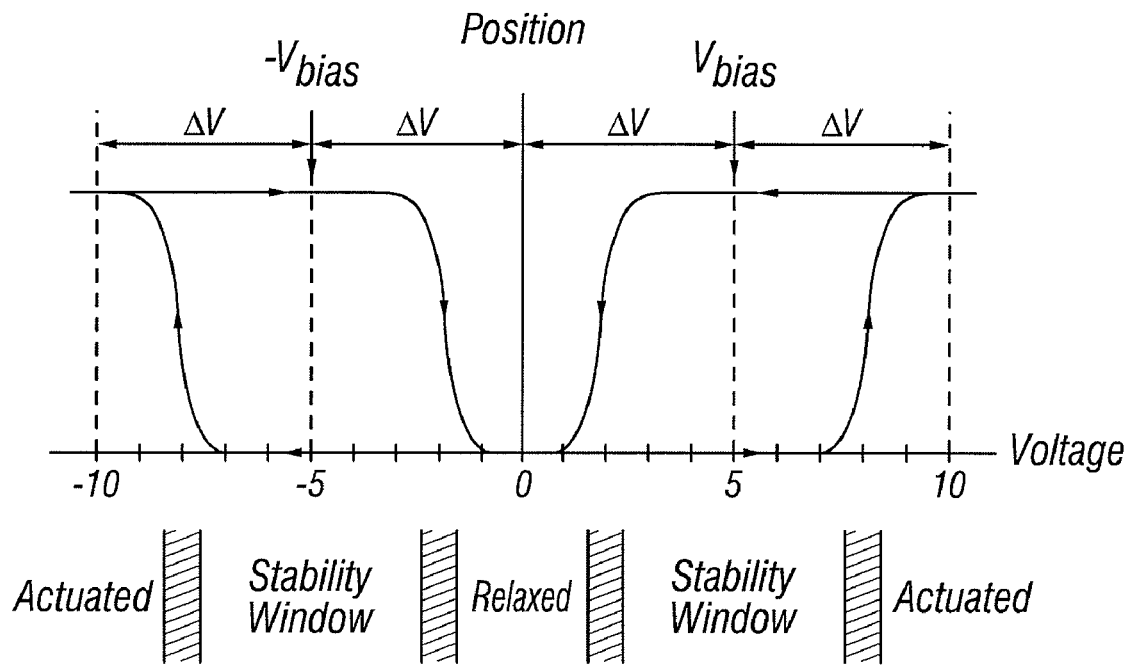
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to $-5$ volts and $+5$ volts respectively. Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $\Delta -V$, producing a zero volt potential difference across the pixel.

Figure 5A:
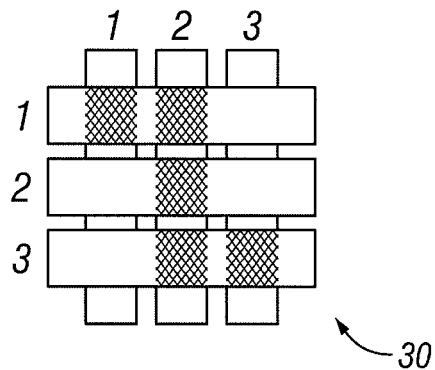
FIGS. 5A and 5B illustrate one exemplary timing diagram for row and column signals that may be used to write a frame of display data to the 3×3 interferometric modulator display of FIG. 2.
Figure 5B:
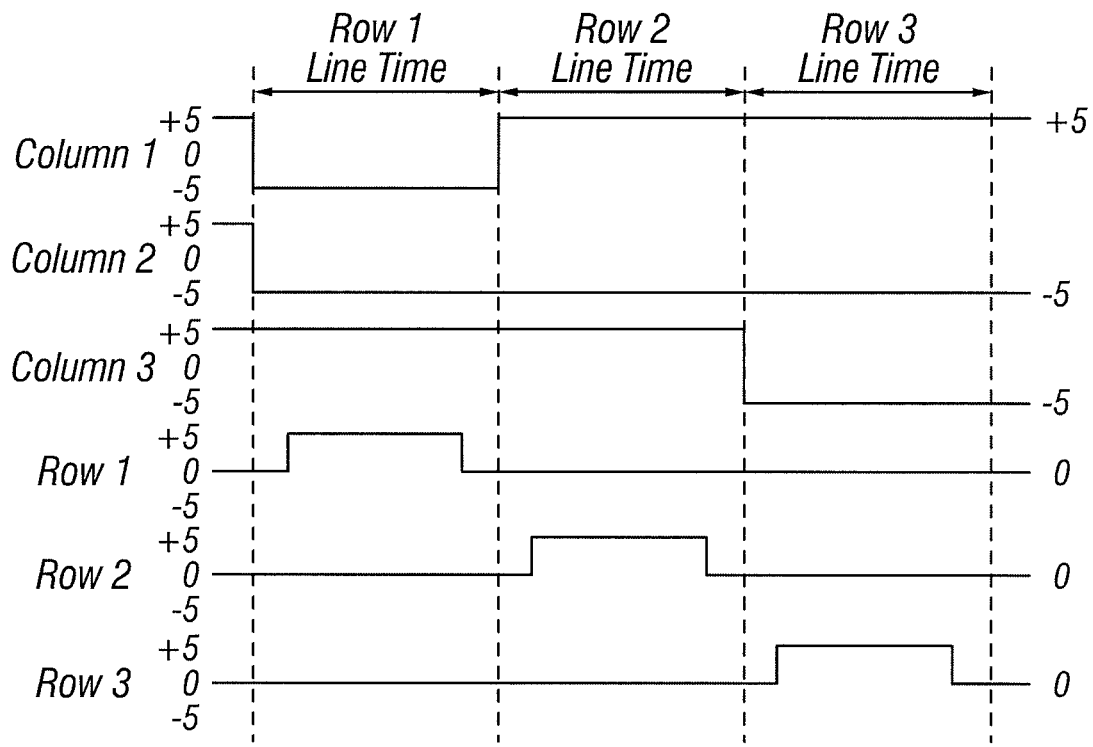

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
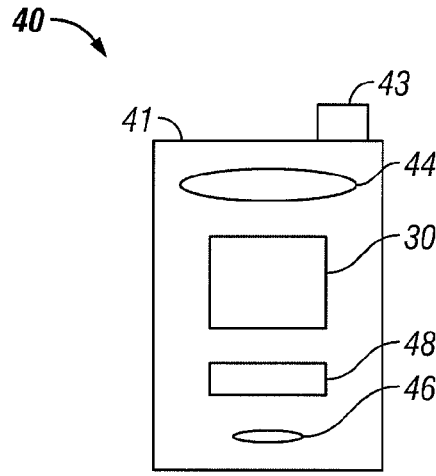
FIGS. 6A and 6B are system block diagrams illustrating an embodiment of a visual display device comprising a plurality of interferometric modulators.
Figure 6B:
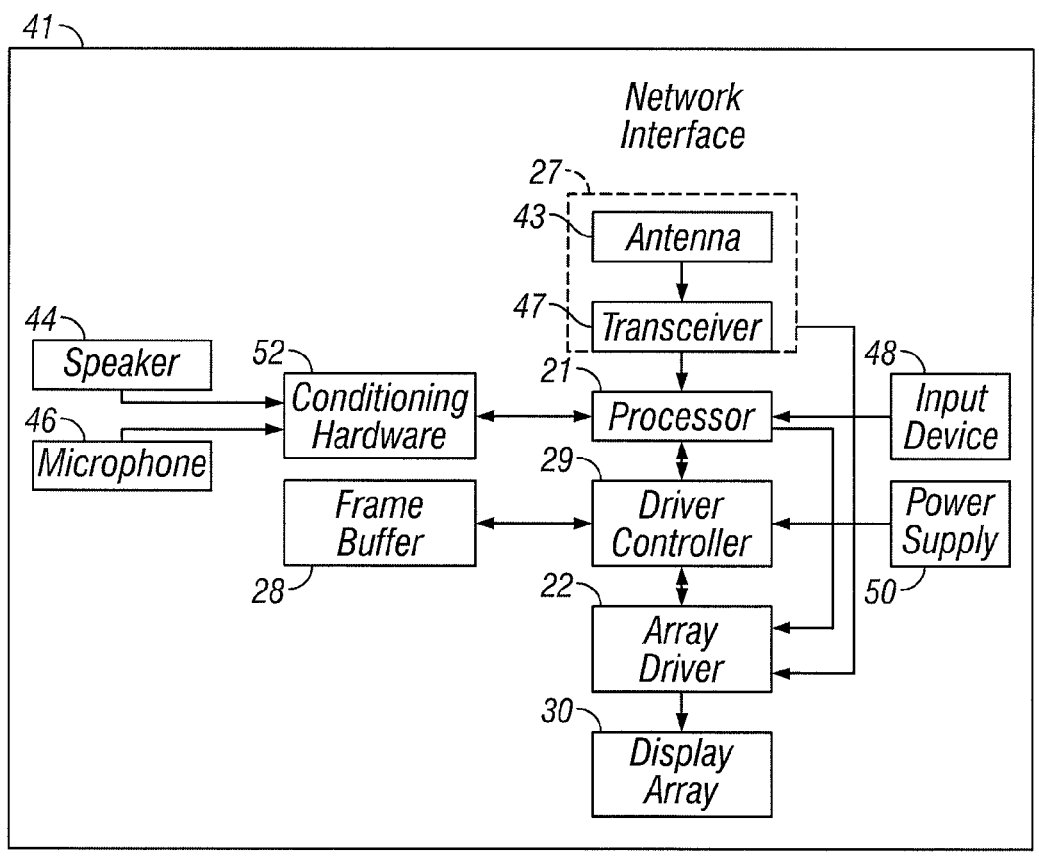

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to the processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28 and to the array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

The processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to the frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. The conditioning hardware 52 generally includes amplifiers and filters for transmitting signals to the speaker 45, and for receiving signals from the microphone 46. The conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, the driver controller 29 is a conventional display controller or a bi-stable display controller (e.g., an interferometric modulator controller). In another embodiment, the array driver 22 is a conventional driver or a bi-stable display driver (e.g., an interferometric modulator display). In one embodiment, the driver controller 29 is integrated with the array driver 22. Such an embodiment is common in highly integrated systems such as cellular phones, watches, and other small area displays. In yet another embodiment, the display array 30 is a typical display array or a bi-stable display array (e.g., a display including an array of interferometric modulators).

The input device 48 allows a user to control the operation of the exemplary display device 40. In one embodiment, the input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

The power supply 50 can include a variety of energy storage devices as are well known in the art. For example, in one embodiment, the power supply 50 is a rechargeable battery, such as a nickel-cadmium battery or a lithium ion battery. In another embodiment, the power supply 50 is a renewable energy source, a capacitor, or a solar cell, including a plastic solar cell, and solar-cell paint. In another embodiment, the power supply 50 is configured to receive power from a wall outlet.

In some implementations control programmability resides, as described above, in a driver controller which can be located in several places in the electronic display system. In some cases control programmability resides in the array driver 22. Those of skill in the art will recognize that the above-described optimization may be implemented in any number of hardware and/or software components and in various configurations.

Figure 7A:
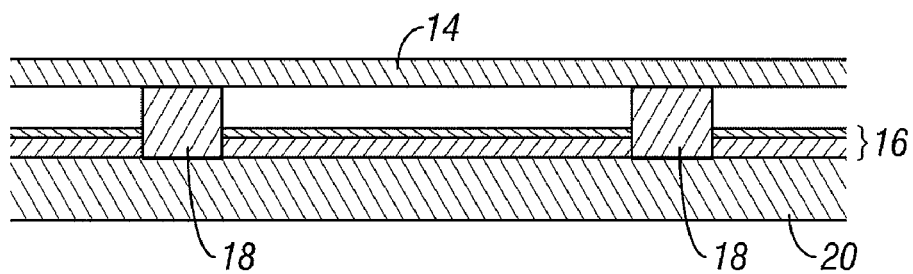
FIG. 7A is a cross section of the device of FIG. 1.
Figure 7B:
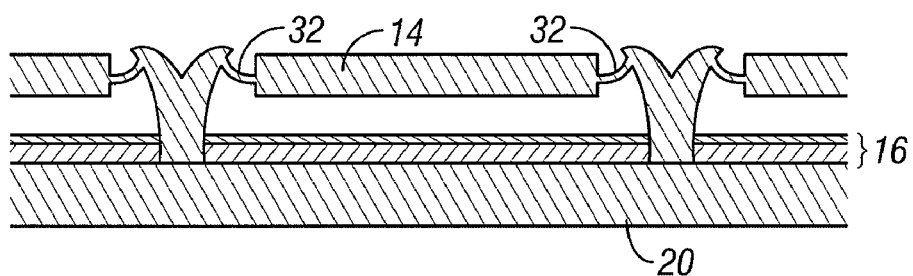
FIG. 7B is a cross section of an alternative embodiment of an interferometric modulator.
Figure 7C:
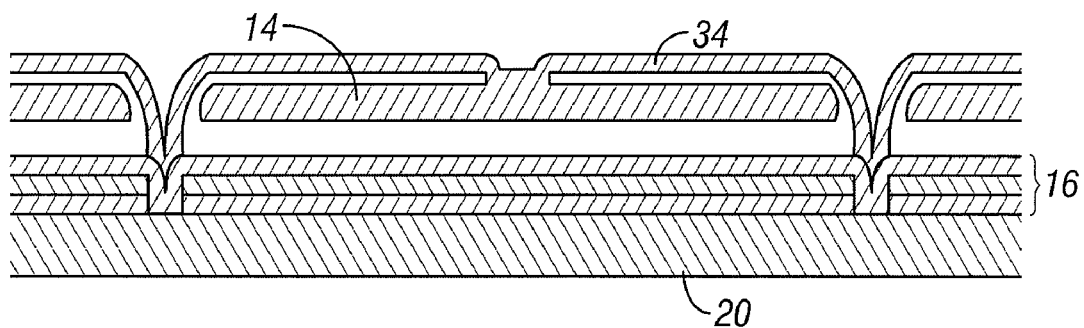
FIG. 7C is a cross section of another alternative embodiment of an interferometric modulator.
Figure 7D:
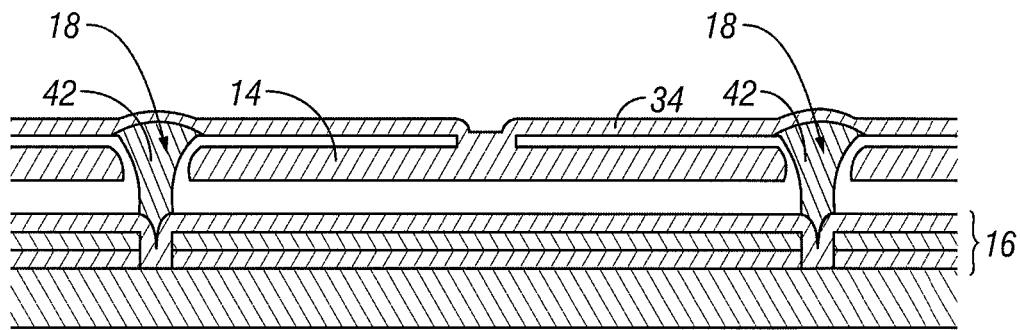
FIG. 7D is a cross section of yet another alternative embodiment of an interferometric modulator.
Figure 7E:
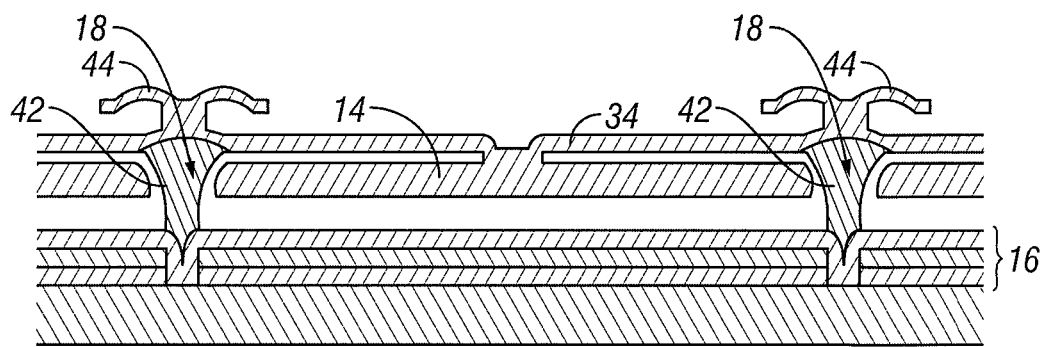
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the movable reflective layer 14 is attached to supports at the corners only, on tethers 32. In FIG. 7C, the movable reflective layer 14 is suspended from a deformable layer 34, which may comprise a flexible metal. The deformable layer 34 connects, directly or indirectly, to the substrate 20 at various locations. The connections are herein referred to as support structures or posts 18. The embodiment illustrated in FIG. 7D has support structures 18 including support post plugs 42 upon which the deformable layer 34 rests. The movable reflective layer 14 remains suspended over the cavity, as in FIGS. 7A-7C, but the deformable layer 34 does not form the support posts 18 by filling holes between the deformable layer 34 and the optical stack 16. Rather, the support posts 18 are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the moving electrode is arranged. In these embodiments, the reflective layer 14 optically shields some portions of the interferometric modulator on the side of the reflective layer opposite the substrate 20, including the deformable layer 34 and the bus structure 44. This allows the shielded areas to be configured and operated upon without negatively affecting the image quality. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Use of Aluminum Fluoride Layer

A microelectromechanical systems (MEMS) device includes a fixed (lower) electrode and a moving (upper) electrode. The fixed and moving electrodes face each other with a gap or cavity therebetween. The moving electrode is movable in the gap between a first (driven) position and a second (undriven) position. The first position is a first distance from the fixed electrode. The second position is a second distance from the fixed electrode. The second distance is greater than the first distance.

In one embodiment, a MEMS device is fabricated as follows. First, a fixed electrode is formed over a substrate. The fixed electrode typically includes a conductive layer(s) and a dielectric layer(s) stacked over the conductive layer. Subsequently, a sacrificial layer is formed over the dielectric layer. Then, support structures such as posts are formed through the sacrificial layer. In addition, a moving electrode is formed over the sacrificial layer and the posts. Then, the sacrificial layer is released or etched away to define the gap or cavity between the fixed and moving electrodes. In other embodiments, the sequence of forming the layers and posts may vary widely depending on the structure of the MEMS device.

In the process described above, an etch stop layer is preferably used to protect the fixed and/or moving electrodes during a release etch of the sacrificial layer. In one embodiment, an etch stop layer may be formed between the fixed electrode and the sacrificial layer. In another embodiment, an etch stop layer may be formed between the moving electrode and the sacrificial layer. In yet another embodiment, etch stop layers may be interposed between the fixed electrode and the sacrificial layer and between the moving electrode and the sacrificial layer.

In some embodiments, after the release of the sacrificial layer, the etch stop layer remains in the MEMS device, forming part of the final device structure. The etch stop layer may be formed of an insulating material, thereby preventing electrical shorts between the fixed and moving electrodes during operation. In certain embodiments, it may serve to minimize stiction between surfaces of the fixed and moving electrodes during operation. "Stiction," as used herein, refers to a tendency of a moving electrode in an actuated position to stick to a fixed electrode in a MEMS device.

In one embodiment, an aluminum fluoride ($AlF_3$) layer is used as an etch stop during a release etch of a sacrificial layer. The sacrificial layer may be formed of molybdenum, silicon or tungsten. A fluorine-based etchant may be used for the release etch of the sacrificial layer. The aluminum fluoride layer may also serve to prevent electrical shorts or to minimize stiction between fixed and moving electrodes during operation of a MEMS device.

While embodiments in this disclosure are illustrated in the context of optical MEMS devices, particularly interferometric modulators, the skilled artisan will appreciate that the configurations of the $AlF_3$ layer described below may apply to other MEMS devices, such as electromechanical capacitive switches.

Figure 8:
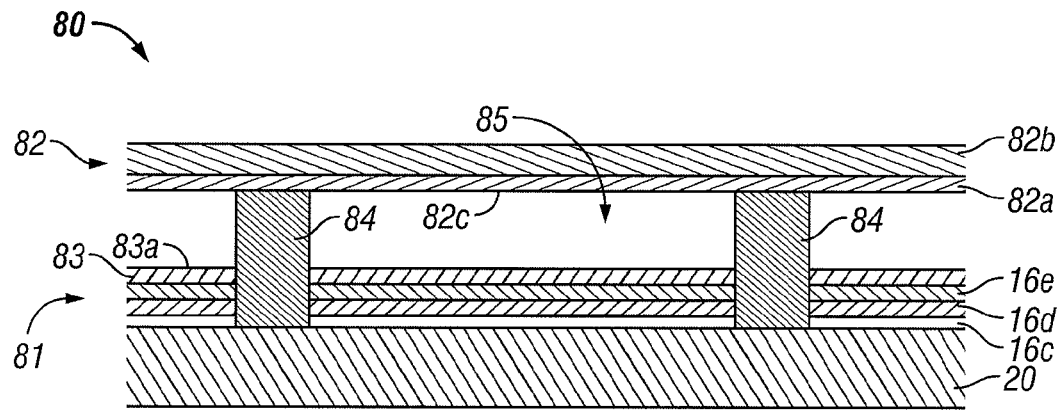
FIG. 8 is a schematic cross section of one embodiment of an interferometric modulator having an aluminum fluoride layer on a fixed electrode.

FIG. 8 is a schematic illustration of an interferometric modulator 80 including an $AlF_3$ layer according to an embodiment. The interferometric modulator 80 has a fixed electrode 81 (preferably at least partially transparent for the illustrated embodiment) and a moving electrode 82 (preferably reflective for the illustrated embodiment) which is supported by support posts 84. The interferometric modulator 80 has a cavity 85 between the fixed and moving electrodes 81, 82. The fixed electrode 81 includes an aluminum fluoride ($AlF_3$) layer 83 having a surface exposed to the cavity 85 and facing the moving electrode 82.

In the illustrated embodiment, the moving electrode 82 of the interferometric modulator 80 is in a relaxed position. In the relaxed position, the moving electrode 82 is at a relative large distance (e.g., 100 nm to 600 nm) from the fixed electrode 81. The distance between the electrodes 81 and 82 depends on desired color. The moving electrode 82 can move down to an actuated position (see FIG. 1, modulator 12b). In the actuated position, the moving electrode 82 is positioned more closely adjacent to the fixed electrode 81, and may be in contact with a top surface 83a of the $AlF_3$ layer 83.

The illustrated fixed electrode 81 overlies a transparent substrate 20, and includes a transparent conductor such as the illustrated indium tin oxide (ITO) layer 16c overlying the substrate 20, a metallic absorber layer 16d overlying the ITO layer 16c, and a dielectric layer 16e overlying the absorber layer 16d. The absorber layer 16d is preferably formed of chromium. In another embodiment for a broad-band white interferometric modulator, the absorber layer 16d may be formed of a semiconductor layer. The semiconductor layer is preferably formed of germanium. The dielectric layer 16e is preferably formed of silicon dioxide and serves to prevent the two electrodes from electrically shorting during operation. In certain embodiments, the dielectric layer 16e may be omitted.

In one embodiment, the fixed electrode 81 further includes the aluminum fluoride ($AlF_3$) layer 83 overlying the dielectric layer 16e. The $AlF_3$ layer 83 can serve as an etch stop layer during a "release" etch of a sacrificial layer that defines the cavity 85 between the electrodes 81, 82, as will be better appreciated from the description of FIG. 10 below. In addition, the $AlF_3$ layer 83 may serve as a dielectric layer to prevent the two electrodes 81, 82 from shorting during operation. The $AlF_3$ layer may also serve to minimize stiction between the fixed and moving electrodes 81, 82 during operation. In certain embodiments, the aluminum fluoride layer may replace the dielectric layer 16e, directly overlying the absorber layer 16d.

In one embodiment, the ITO layer 16c may have a thickness between about 100 Å and about 800 Å. The absorber layer 16d may have a thickness between about 1 Å and about 50 Å, preferably between about 10 Å and about 40 Å. In certain embodiments, the absorber layer may be omitted. The dielectric layer 16e may have a thickness between about 100 Å and about 1,600 Å. The $AlF_3$ layer 83 may have a thickness between about 50 Å and about 200 Å, preferably between about 70 Å and about 150 Å. Together, the layers define an optical stack or fixed electrode 81.

In the illustrated embodiment, the moving electrode 82 includes a reflective layer or mirror 82a and a mechanical or deformable layer 82b. In the illustrated embodiment, the reflective layer 82a is attached or fused to the deformable layer 82b; in other arrangements, the reflective layer or mirror may be suspended from the deformable layer (see, e.g., FIGS. 7C-7E). The reflective layer 82a is preferably formed of a reflective metal, preferably, Al, Au, Ag, or an alloy of the foregoing, and is thick enough to reflect light incident upon the substrate for interferometric effect. The deformable layer 82b is preferably formed of nickel. In certain embodiments where the MEMS device is used as an electromechanical capacitive switch, the moving electrode may include a conductor such as Cu, Pt, Ni, Au, Al, or an alloy of the foregoing. The deformable layer 82b preferably has a thickness that is sufficient to provide mechanical support while being sufficiently thin and flexible to allow the moving electrode 82 to move toward the fixed electrode 81. The deformable layer 82b may have a thickness on the order of several thousand angstroms. In an exemplary embodiment, the reflective layer 82a has a thickness of about 300 Å, and the deformable layer 82b has a thickness of about 1000 Å. The thicknesses of the layers 82a and 82b can be different in other embodiments.

The support posts 84 are configured to support the moving electrode 82. The posts 84 can be made of a number of materials, but in the illustrated embodiment are formed of an inorganic dielectric material, such as silicon nitride, silicon dioxide or aluminum oxide. The reflective layer 82a is configured to cover top surfaces of the support posts 84, as shown in FIG. 8. In other arrangements, the support posts can include a "rivet" formed in the depression above the deformable layer 82b. In certain embodiments, the reflective layer may be tethered to the support posts, as shown in FIG. 7B.

Figure 9:
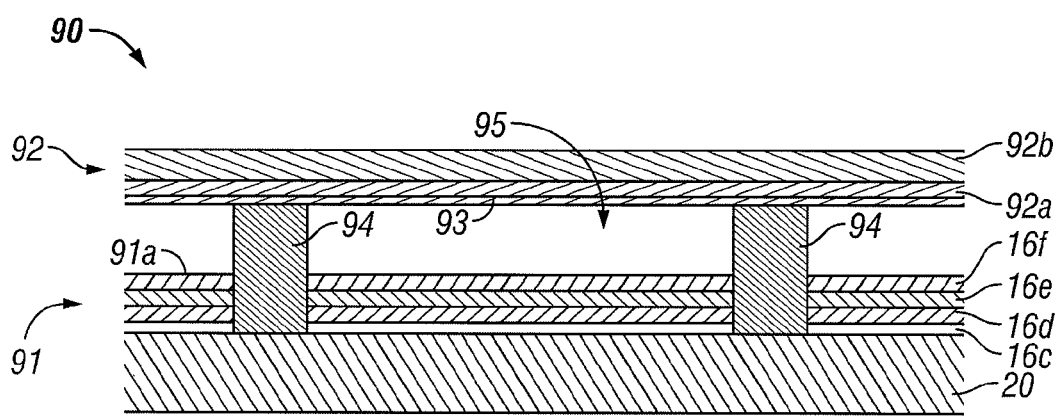
FIG. 9 is a schematic cross section of another embodiment of an interferometric modulator having an aluminum fluoride layer on a moving electrode.

FIG. 9 illustrates an interferometric modulator 90 including an $AlF_3$ layer according to another embodiment. The interferometric modulator 90 has a fixed electrode 91 and a moving electrode 92 supported by support posts 94. The interferometric modulator 90 has a cavity 95 between the fixed and moving electrodes 91, 92. The moving electrode 92 includes an $AlF_3$ layer 93 having a surface exposed to the cavity 95 and facing the fixed electrode 91.

In FIG. 9, the moving electrode 92 of the interferometric modulator 90 is in a relaxed position. In the relaxed position, the moving electrode 92 is at a relative large distance from the fixed electrode 91. The moving electrode 92 can move down to an actuated position (not shown). In the actuated position, the moving electrode 92 is positioned more closely adjacent to the fixed electrode 91, and may be in contact with a top surface 91a of the fixed electrode 91.

The fixed electrode 91 overlies a transparent substrate 20, and includes an indium tin oxide (ITO) layer 16c overlying the substrate 20, a metallic absorber layer 16d overlying the ITO layer 16c, a first dielectric layer 16e overlying the absorber layer 16d, and a second dielectric layer 16f overlying the first dielectric layer 16e. The absorber layer 16d is preferably formed of chromium. In another embodiment for a broad-band white interferometric modulator, the absorber layer 16d may be formed of a semiconductor layer. The semiconductor layer is preferably formed of germanium. The first dielectric layer 16e may be formed of silicon dioxide. The second dielectric layer 16f may be formed of aluminum oxide and may serve as an etch stop during a release etch of a sacrificial layer, as will be better appreciated from the description of FIG. 11 below. In certain embodiments, either or both of the dielectric layers 16e and 16f may be omitted. In one embodiment, the ITO layer 16c may have a thickness between about 100 Å and about 800 Å. The absorber layer 16d may have a semitransparent thickness, preferably between about 1 Å and about 50 Å, more preferably between about 10 Å and about 40 Å. The overall thickness of the first and second dielectric layers 16e and 16f may be between about 100 Å and about 1,600 Å. in other embodiments, the thicknesses of the dielectric layers 16e and 16f may be adjusted such that the fixed electrode 91 is a color filter.

The moving electrode 92 may include a reflective layer 92a and a deformable layer 92b. In the illustrated embodiment, the reflective layer 92a is preferably formed of a reflective metal, such as Al, Au, Ag, or an alloy of the foregoing. In certain embodiments where the MEMS device is used as an electromechanical capacitive switch, the moving electrode 92 may be formed of a conductor such as Cu, Pt, Ni, Au, Al, or an alloy of the foregoing. The deformable layer 92b is preferably formed of nickel. The layers 92a and 92b can have thicknesses as described above with respect to the layers 82a and 82b of FIG. 8.

In the illustrated embodiment, the moving electrode 92 further includes an $AlF_3$ layer having a surface exposed to the cavity 95. The $AlF_3$ layer 93 forms part of the moving electrode 92 and may serve to prevent the moving and fixed electrodes 91, 92 from electrically shorting during operation. In addition, the $AlF_3$ layer 93 may serve to minimize stiction between the electrodes during operation. The $AlF_3$ layer 93 may have a thickness between about 50 Å and about 200 Å, preferably between about 70 Å and about 150 Å.

The support posts 94 are configured to support the moving electrode 92, and are preferably formed of a dielectric material. The support posts 94 can be as described above with respect to the support post 84 of FIG. 8. The deformable layer 92b, which is preferably formed of nickel, covers a top surface of the reflective layer 92a, as shown in FIG. 9. In other embodiments, the reflective layer may be suspended from the deformable layer, as shown in FIGS. 7C-7E. In certain embodiments, the reflective layer may be tethered to the support posts, as shown in FIG. 7B.

In an unpictured embodiment, an interferometric modulator has a moving electrode and a fixed electrode, both of which have an $AlF_3$ layer. Each $AlF_3$ layer is exposed to a cavity between the electrodes, facing the other electrode. The configurations of the electrodes and the $AlF_3$ layers can be as described above with respect to those of the interferometric modulators of FIGS. 8 and 9.

The interferometric modulators of the above embodiments are described by way of example. The $AlF_3$ layers in the embodiments may generally apply to microelectromechanical devices which have electrodes different from those shown. A skilled artisan will appreciate that electrode structure and configuration may be varied depending on the design of a given microelectromechanical device.

Method of Making an Interferometric Modulator

FIGS. 10A-10F illustrate a method of making the interferometric modulator of FIG. 8 according to an embodiment. In the method, an $AlF_3$ layer is formed on a fixed electrode, facing a moving electrode.

Figure 10A:
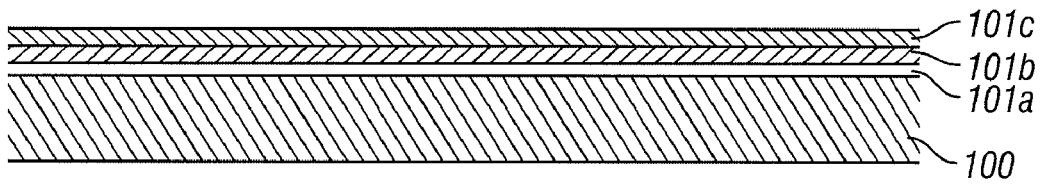
FIGS. 10A-10F are schematic cross sections illustrating a method of making the interferometric modulator of FIG. 8 according to one embodiment.

In FIG. 10A, an optical stack is provided over a transparent substrate 100. In the illustrated embodiment, the optical stack has a transparent conductor in the form of an ITO layer 101a overlying the substrate 100, an absorber layer 101b overlying the ITO layer 101a, and a dielectric layer 101c overlying the absorber layer 101b. The absorber layer 101b is preferably formed of chromium. In another embodiment for a broadband white interferometric modulator, the absorber layer 101b may be formed of a semiconductor layer. The semiconductor layer is preferably formed of germanium. The dielectric layer 101c may be formed of silicon dioxide. The layers 101a-101c may have thicknesses as described above with respect to the layers 16c-16e of FIG. 8. In a process not shown here, the ITO layer 101a and the absorber layer 101b are patterned and etched to form electrode lines or other useful shapes as called for by the display design. By convention, the lower electrodes defined by the optical stack will be referred to as row electrodes.

Figure 10B:
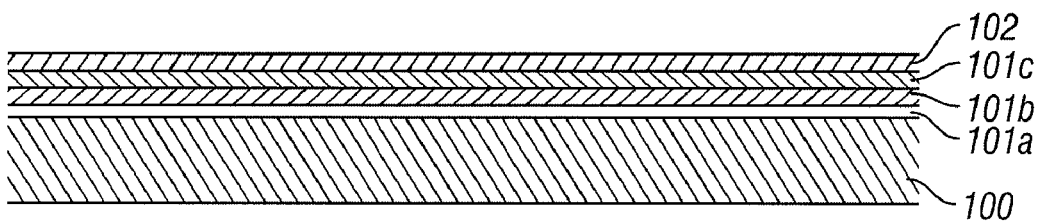

An aluminum fluoride ($AlF_3$) layer 102 is formed on the dielectric layer 101c, as shown in FIG. 10B. In the illustrated embodiment, the $AlF_3$ layer 102 has a thickness between about 50 Å and about 200 Å, preferably between about 70 Å and about 150 Å. The $AlF_3$ layer 102 will serve as an etch stop during a release step which will be described later. The $AlF_3$ layer 102 may also serve as a dielectric layer together with the dielectric layer 101c during operation of the interferometric modulator. In certain embodiments, the $AlF_3$ layer 102 may replace the dielectric layer 101c. In such embodiments, the $AlF_3$ layer may have a thickness between about 50 Å and about 150 Å.

In one embodiment, the $AlF_3$ layer 102 may be formed by a physical vapor deposition (PVD) process. An exemplary PVD process is a sputtering deposition process. In the sputtering deposition process, the substrate 100 having the layers 101a-101c formed thereon is placed in a PVD chamber. A solid target formed of $AlF_3$ is also placed in the chamber. During sputtering deposition, an ion beam is irradiated onto the target. Upon irradiation of the ion beam, $AlF_3$ is sputtered from the target onto a top surface of the dielectric layer 101c. In one embodiment, the sputtering process is performed in an argon (Ar) atmosphere.

Figure 10C:
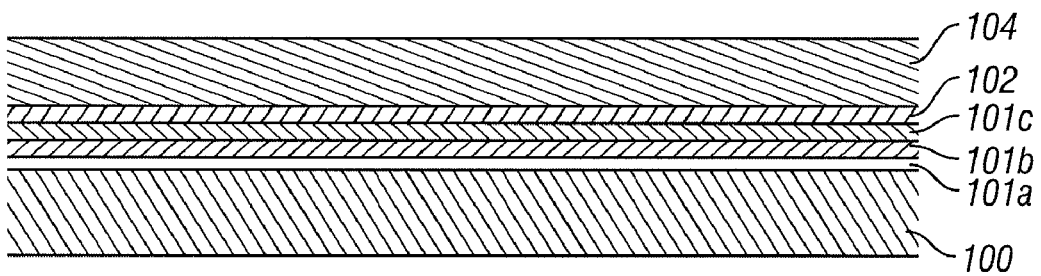

Subsequently, a sacrificial layer 104 is formed over the $AlF_3$ layer 102, as shown in FIG. 10C. The sacrificial layer 104 is preferably formed of a material capable of selective removal without harm to other materials that define the cavity. In the illustrated embodiment, the sacrificial layer 104 is formed of molybdenum. Other examples of sacrificial materials susceptible to selective removal by fluorine-based etchants include silicon and tungsten.

Figure 10D:
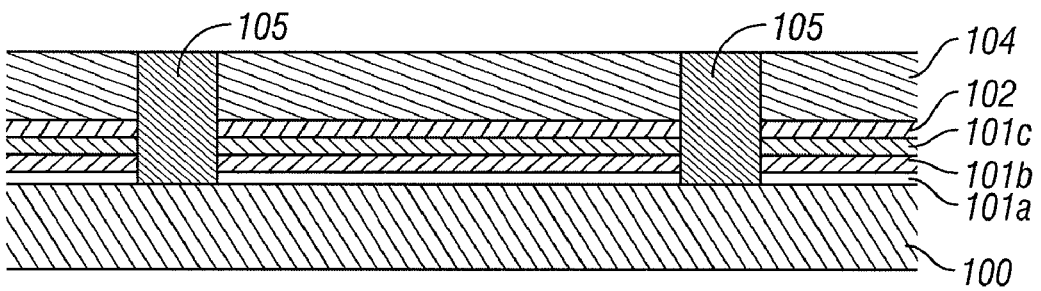

Next, steps for forming support posts and a moving electrode are performed. A lithographic process, preferably a photolithographic process, is performed to pattern the sacrificial layer 104 to provide recesses for support posts 105. A photoresist is provided and patterned over the sacrificial layer 104. Then, the sacrificial layer 104 is etched using a dry or wet etch process, preferably using a fluorine-based dry etchant such as $SF_6/O_2$, $CF_4/O_2$, or $NF_3$, or a chlorine-based etchant such as $Cl_2/BCl_3$. The photoresist is then stripped. Then, a material for the posts 105, preferably an inorganic dielectric material such as silicon dioxide, is deposited over exposed surfaces, including surfaces of the sacrificial layer 104. Subsequently, the material for the posts 105 is etched back or patterned to form posts, using a suitable etch process, including a wet or dry etch process, as shown in FIG. 10D. While illustrated schematically as merely filling the opening in the sacrificial layer 104, it will be understood that the upper end of the posts may be wider than the opening, extending over an upper surface of the sacrificial layer 104.

Figure 10E:
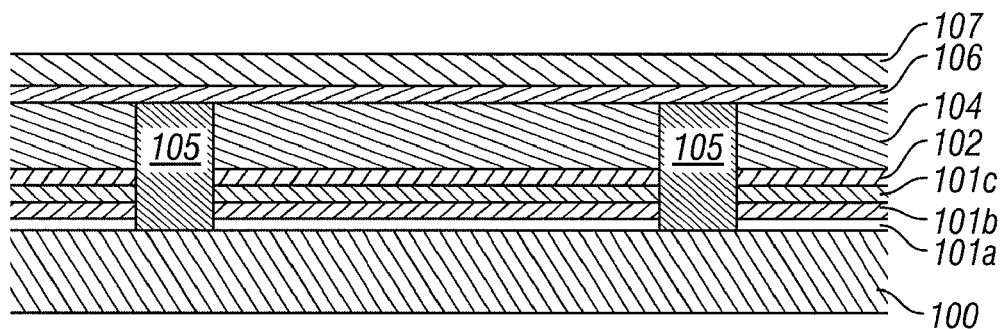

A reflective layer 106 is then deposited over the sacrificial layer 104 and the support posts 105, as shown in FIG. 10E. The reflective layer 106 is preferably formed of a specular metal such as Al, Au, Ag, or an alloy of the foregoing. In certain embodiments where the MEMS device is used as an electromechanical capacitive switch, the layer 106 may be formed of a conductor such as Cu, Pt, Ni, Au, Al, or an alloy of the foregoing.

Then, a material for a mechanical or deformable layer 107 is deposited over the reflective layer 106, as shown in FIG. 10E. The material for the deformable layer 107 is preferably nickel. Then, the aluminum and nickel layers 106 and 107 are patterned and etched to define arrays of MEMS devices. In certain embodiments, the deformable layer 107 and the reflective layer 106 are etched to provide through-holes (not shown) in the middle. The etch process can be either a wet or dry etch process. The holes serve to permit etchant to enter and etch by-product to exit at a release step which will be later described. In addition, the holes provide an exit for air when the reflective layer 106 moves between the relaxed and actuated positions. FIG. 10E illustrates a cross-section of a completed "unreleased" interferometric modulator structure with the sacrificial layer 104 in place.

In an unpictured embodiment, after a sacrificial layer is formed on an optical stack, a reflective layer is formed and patterned thereon. Subsequently, another sacrificial layer is deposited over the reflective layer. Then, the sacrificial layers are patterned to provide recesses for support posts, and the support posts are formed. Subsequently, a deformable layer is formed over the second sacrificial layer and the support posts. This process provides a deformable layer from which the reflective layer can be suspended, as described above with reference to FIGS. 7C-7E. Although not illustrated, a skilled artisan will appreciate that different steps may be performed to form electrode structures having options such as a tethered moving electrode, as shown in FIG. 7B.

Figure 10F:
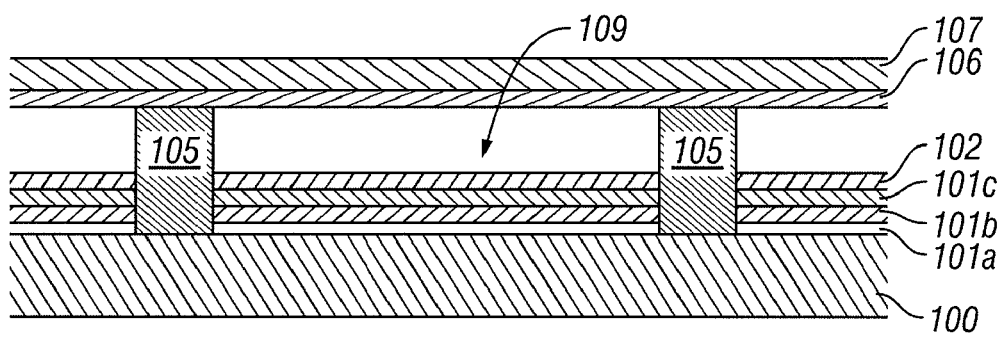

Finally, the sacrificial layer 104 is selectively removed, leaving a cavity or gap 109 between the reflective layer 106 and the $AlF_3$ layer 102, as shown in FIG. 10F. This step is referred to as a "release" or "sacrificial etch" step. The illustrated sacrificial layer 104 which is formed of molybdenum is preferably etched using a fluorine-based etchant, for example, a $XeF_2$-based etchant, which selectively etches molybdenum without attacking other exposed materials ($AlF_3$, $SiO_2$, Al, etc.) that define the cavity 109. A resulting "released" MEMS device, particularly interferometric modulator, is shown in FIG. 10F. Although not illustrated, a skilled artisan will appreciate that different steps may be performed to form electrode structures having options such as tethered or suspended moving electrode, as shown in FIGS. 7B-7E.

FIGS. 11A-11E illustrate a method of making the interferometric modulator of FIG. 9 according to another embodiment. In the method, an $AlF_3$ layer is formed on a moving electrode beneath a reflective layer, facing a fixed electrode.

Figure 11A:
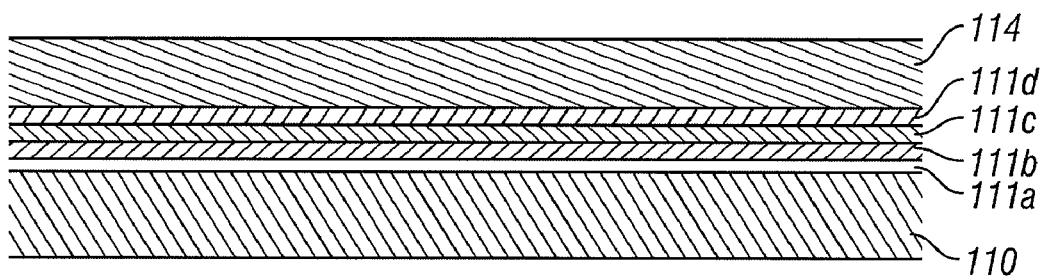
FIGS. 11A-11E are schematic cross sections illustrating a method of making the interferometric modulator of FIG. 9 according to another embodiment.
Figure 11B:
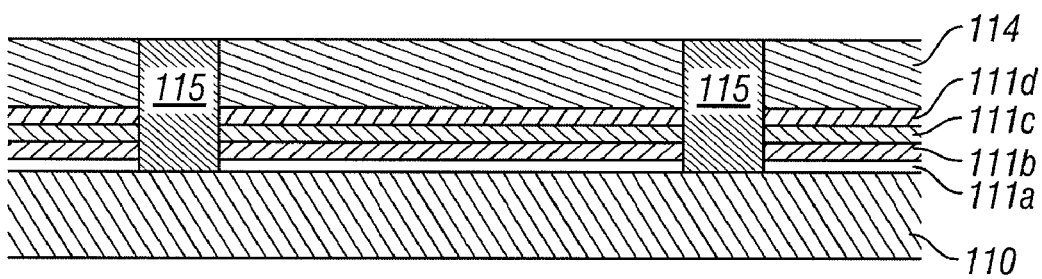
Figure 11C:
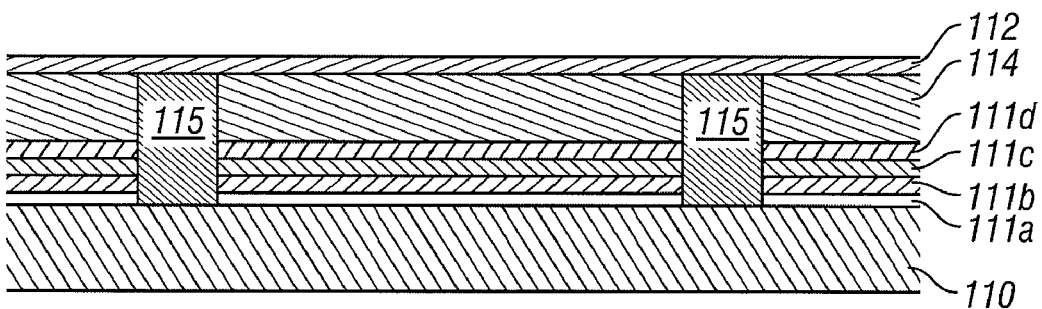

In FIG. 11A, an optical stack is provided over a transparent substrate 110. In the illustrated embodiment, the optical stack has a transparent conductor in the form of an ITO layer 111a overlying the substrate 110, a metallic absorber layer 111b overlying the ITO layer 111a, a first dielectric layer 111c overlying the absorber layer 111, and a second dielectric layer 111d overlying the first dielectric layer 111c. The absorber layer 111b is preferably formed of chromium. In another embodiment for a broad-band white interferometric modulator, the absorber layer 111b may be formed of a semiconductor layer. The semiconductor layer is preferably formed of germanium. The first dielectric layer 111c may be formed of silicon dioxide. The second dielectric layer 111d may be formed of aluminum oxide and may serve as an etch stop layer during a release etch of a sacrificial layer overlying the second dielectric layer 111d. The layers 111a-111d may have thicknesses as described above with respect to the layers 16c-16f of FIG. 9. The use of the second dielectric layer 111d is optional, such that, in certain embodiments, the optical stack may have only one dielectric layer, depending on materials, etchants and selectivity of a release etch which will be described later.

Subsequently, a sacrificial layer 114 is formed on the second dielectric layer 111d, as shown in FIG. 11A. In the illustrated embodiment, the sacrificial layer 114 is formed of molybdenum. Other examples of sacrificial materials include silicon and tungsten. A thickness of the sacrificial layer 114 corresponds to a height of a relaxed MEMS device cavity (the cavity is typically larger than the thickness of the sacrificial layer 114 due to the mechanical layer's launch angle from the supports and inherent tension), and thus determines color displayed by the MEMS device during operation. In other arrangements, multiple thicknesses of sacrificial material are provided across the array for forming interferometric modulators for different colors, as will be better understood from the description below of FIGS. 12A-12H.

Next, a step for forming support posts 115 is performed. A photolithographic process is performed to pattern the sacrificial layer 114 for forming recesses for the support posts 115. While illustrated as having vertical sidewalls, in reality the recesses may have sloped sidewalls. A photoresist is provided and patterned over the sacrificial layer 114. Then, the sacrificial layer 114 is etched using a dry or wet etch process, preferably using a fluorine-based dry etchant such as $SF_6/O_2$, $CF_4/O_2$, or $NF_3$, or a chlorine-based etchant such as $Cl_2/BCl_3$. The photoresist is then stripped. Then, a material for the posts 115, preferably an inorganic dielectric material such as silicon dioxide, is deposited over exposed surfaces, including surfaces of the sacrificial layer 114. Subsequently, the material for the posts 115 is etched back or patterned to form the posts 115, using a suitable etch process, including a wet or dry etch process. While illustrated schematically as being etched back to fill only the support recesses, instead a photoresist mask can be used to pattern the posts 115 with a wider upper portion or wings overlying the top surface of the sacrificial layer 114.

Next, an $AlF_3$ layer 112 is deposited on the sacrificial layer 114 and the posts 115. The $AlF_3$ layer 112 preferably has a thickness of between about 50 Å and about 200 Å, preferably between about 70 Å and about 150 Å. $AlF_3$ may be deposited using a PVD process as described above with respect to the $AlF_3$ layer of FIG. 10B.

Figure 11D:
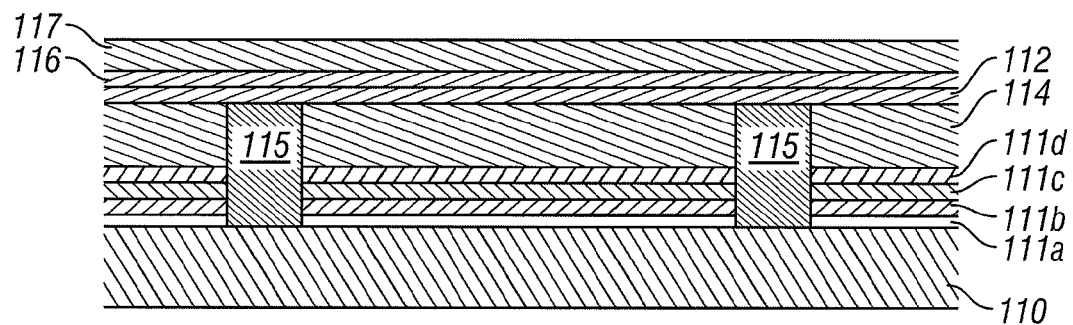

Subsequently, a reflective layer 116 is deposited over the $AlF_3$ layer 112, as shown in FIG. 11D. The reflective layer 116 is preferably formed of a specular metal such as Al, Au, Ag, or an alloy of the foregoing. In certain embodiments where the MEMS device is used as an electromechanical capacitive switch, the layer 116 may be formed of a conductor such as Cu, Pt, Ni, Au, Al, or an alloy of the foregoing.

Next, a material for a mechanical or deformable layer 117 is deposited over the reflective layer 116, as shown in FIG. 11D. The material is preferably nickel. In certain embodiments, the deformable layer 116 and the reflective layer 115 are etched to provide through-holes in the middle. The etch process can be either a wet or dry etch process. The holes serve to permit etchant to enter and etch by-product to exit at a release step which will be later described. In addition, the holes provide an exit for air when the reflective layer moves between the relaxed and actuated positions. FIG. 11D illustrates a cross-section of a completed "unreleased" interferometric modulator structure with the sacrificial layer in place.

In an unpictured embodiment, after a sacrificial layer is formed on an optical stack, a reflective layer is formed and patterned thereon. Subsequently, another sacrificial layer is deposited over the reflective layer. Then, the sacrificial layers are patterned to provide recesses for support posts, and the support posts are formed. Subsequently, a deformable layer is formed over the second sacrificial layer and the support posts. This process provides a deformable layer from which the reflective layer can be suspended, as described above with reference to FIGS. 7C-7E. Although not illustrated, a skilled artisan will appreciate that different steps may be performed to form electrode structures having options such as a tethered moving electrode, as shown in FIG. 7B.

Figure 11E:
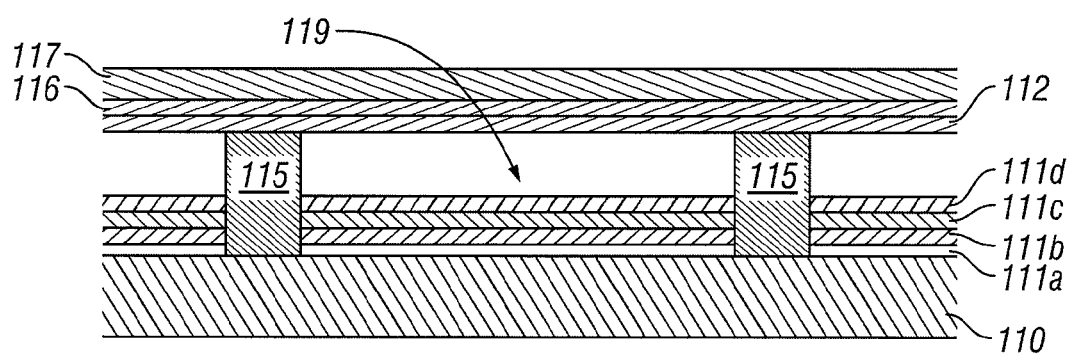

Finally, the sacrificial layer 114 is selectively removed, leaving a cavity or gap 119 between the second dielectric layer 111d and the $AlF_3$ layer 112, as shown in FIG. 11E. The illustrated sacrificial layer 114 which is formed of molybdenum is preferably etched using a fluorine-based etchant such as a $XeF_2$-based etchant. The $AlF_3$ layer 112 protects the critical mirror surface of the reflective layer 116 from etch damage while the sacrificial layer 114 is removed. A resulting MEMS device, particularly a released interferometric modulator, is shown in FIG. 11E. In addition, in the resulting MEMS device, the $AlF_3$ layer 112 may serve to minimize stiction between the moving and fixed electrodes.

In an unpictured embodiment, an interferometric modulator is formed to have a moving electrode and a fixed electrode, both of which have an $AlF_3$ layer. Each $AlF_3$ layer is exposed to a cavity between the electrodes, facing the other electrode. First, an optical stack is provided over a transparent substrate. Then, an $AlF_3$ layer is formed on the optical stack. Subsequently, a sacrificial layer is formed on the $AlF_3$ layer. Then, a step for forming support posts is performed. Another $AlF_3$ layer is formed on the sacrificial layer. Then, a reflective layer is deposited on the other $AlF_3$ layer. Next, a material for a mechanical or deformable layer is deposited on the reflective layer. Finally, the sacrificial layer is released, forming a cavity between the $AlF_3$ layers. Details about forming the layers are as described above with reference to FIGS. 10 and 11.

FIGS. 12A-12H are cross-sectional views illustrating a method of making an array of interferometric modulators according to another embodiment. The method utilizes a lower and upper etch stop layers stacked over each other to protect a fixed electrode or optical stack from exposure to multiple etch steps. In one embodiment, the lower etch stop layer is preferably formed of aluminum fluoride. Generally, the upper etch stop layer can be used to protect the lower etch stop layer from etchants used to pattern layers formed above the upper etch stop layer. In one embodiment, the layers above the upper etch stop layer to be patterned are multiple sacrificial material layers used to form various gap heights of an interferometric modulator device. This upper etch stop layer is eventually at least partially removed in a release etch process, during which the lower etch stop layer then serves to protect underlying layers from the etch release process.

Figure 12C:
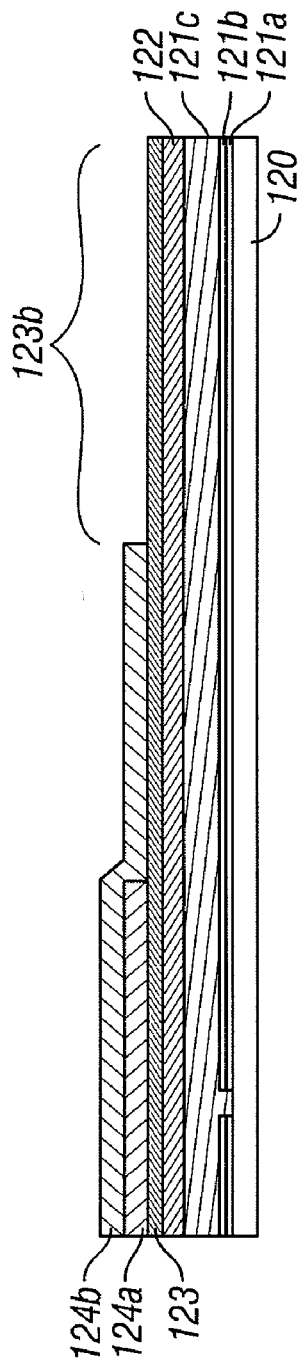

In FIGS. 12A-12H, the formation of an array of three interferometric modulators including a red subpixel 200, a green subpixel 210, and a blue subpixel 220 (FIG. 12H) will be illustrated. Each of the interferometric modulators 200, 210, 220 has a different distance in the relaxed state between a lower electrode 121a, 121b and an upper metal mirror layer 126a, 126b, 126c, as indicated in FIG. 12H, which shows final configurations. Color displays may be formed by using three (or more) modulator elements to form each pixel in the resulting image. The dimensions of each interferometric modulator cavity (e.g., the cavities 129a, 129b, 129c in FIG. 12H) determine the nature of the interference and the resulting color.

One method of forming color pixels is to construct arrays of interferometric modulators, each having cavities of differing sizes, e.g., three different sizes corresponding to red, green and blue as shown in this embodiment. The interference properties of the cavities are directly affected by their dimensions. In order to create these varying cavity dimensions, multiple sacrificial layers may be fabricated and patterned as described below so that the resulting pixels reflect light corresponding to each of the three primary colors. Other color combinations are also possible, as well as the use of black and white pixels.

FIG. 12A illustrates an optical stack 150 similar to those previously discussed (e.g., the optical stack 101a-101c and 102 of FIGS. 10A-10F) formed by first creating an electrode layer by depositing an indium tin oxide (ITO) electrode layer 121a on a transparent substrate 120, then depositing a metallic absorber layer 121b on the indium tin oxide electrode layer 121a, forming a composite layer which will be referred to as the lower electrode layer 121a, 121b. In the illustrated embodiment, the absorber layer 121b comprises chromium. Other metals, such as molybdenum and titanium, or semiconductors such as germanium, may also be used to form the absorber layer 121b.

The viewing surface 120a of the transparent substrate 120 is on the opposite side of the substrate 120 from the lower electrode layer 121a, 121b. In a process not shown here, the lower electrode layer 121a, 121b is patterned and etched to form electrode lines (e.g., row electrodes) or other useful shapes as required by the display design.

As indicated in FIG. 12A, the optical stack 150 also includes a dielectric layer 121c, which may comprise, for example, silicon oxide or a charge trapping layer, such as silicon nitride, over the lower electrode layer 121a, 121b. The dielectric layer 121c is typically formed after the lower electrode layer 121a, 121b has been patterned and etched. In addition, the optical stack 150 includes a first etch stop or barrier layer 122 over the dielectric or charge trapping layer 121c. In one embodiment, the first etch stop layer 122 preferably comprises aluminum fluoride ($AlF_3$). A second etch stop or barrier layer 123 is deposited over the first etch stop layer 122. In various embodiments, the second etch stop layer 123 comprises silicon oxide, silicon nitride, molybdenum, titanium, or amorphous silicon, depending on the choice of the overlying sacrificial layers.

FIG. 12A further illustrates a first pixel sacrificial layer 124a formed by depositing molybdenum (in the illustrated embodiment) over the optical stack 150 (and thus over the first and second etch stop layers 122, 123, the dielectric layer 121c, and the lower electrode layer 121a, 121b). In other arrangements, the sacrificial material can be, e.g., titanium or amorphous silicon, but in any event is selected to be different from and selectively etchable relative to the second etch stop layer 123 directly below. The molybdenum of the illustrated embodiment is etched to form the first pixel sacrificial layer 124a, thereby exposing a portion 123a of the second etch stop layer 123, which overlies a corresponding portion of the first etch stop layer 122 that will ultimately be included in the resulting green and blue interferometric modulators 210, 220 (FIG. 12H). The thickness of the first sacrificial layer 124a (along with the thicknesses of subsequently deposited layers as described below) influences the size of the corresponding cavity 119a (FIG. 12H) in the resulting interferometric modulator 200. The etchant used to remove a portion of first sacrificial layer 124a is preferably chosen so as to not etch the second etch stop layer 123, or to etch it at a much lower rate than the sacrificial layer 124a. Thus, although the portion 123a of the second etch stop layer 123 is exposed, it is preferably as unaffected by these etchants as is possible. An exemplary etchant is a phosphoric/acetic/nitric acid or "PAN" etchant, which selectively removes molybdenum relative to the material of the second etch stop layer 123 (e.g., silicon oxide, silicon nitride, titanium or amorphous silicon).

FIGS. 12B-12C illustrate forming a second pixel sacrificial layer 124b by deposition, masking and patterning over the exposed portion 123a of the second etch stop layer 123 and the first pixel sacrificial layer 124a. The second pixel sacrificial layer 124b preferably comprises the same sacrificial material as the first pixel sacrificial layer 124a (molybdenum in this embodiment). Accordingly, the same selective etch chemistry can be employed. The second pixel sacrificial layer 124b is patterned and etched as illustrated in FIG. 12C to expose a portion 123b of the second etch stop layer 123 which overlies a corresponding portion of the first etch stop layer 122 that will ultimately be included in the resulting blue interferometric modulator 220 (FIG. 12H).

Figure 12D:
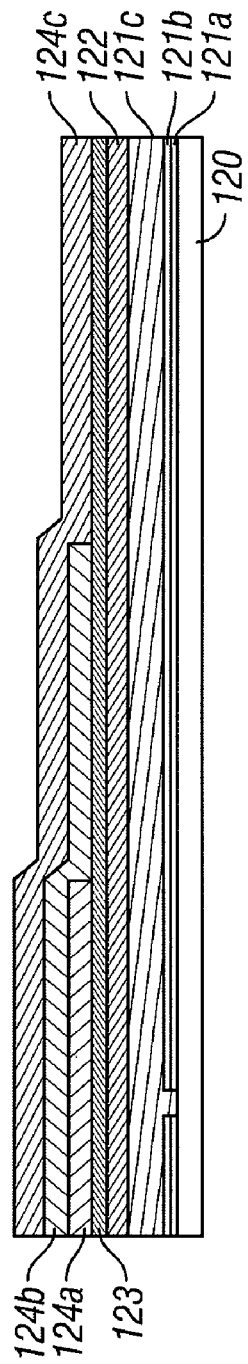

A third pixel sacrificial layer 124c is then deposited over the exposed portion 123b of the second etch stop layer 123 and the second pixel sacrificial layer 124b as illustrated in FIG. 12D. The third pixel sacrificial layer 124c need not be patterned or etched in this embodiment, since its thickness will influence the sizes of all three cavities 119a, 119b, 119c in the resulting interferometric modulators 200, 210, 220 (FIG. 12H). The three deposited pixel sacrificial layers 124a, 124b, 124c do not necessarily have the same thickness.

Figure 12E:
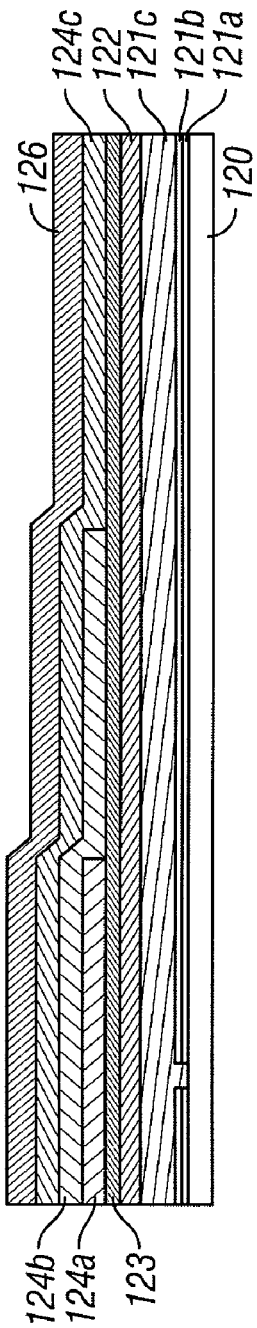

FIG. 12E illustrates forming a reflective layer 126 by depositing a layer of aluminum-containing metal over the third pixel sacrificial layer 124c. In the illustrated embodiment, the reflective layer 126 also serves as an electrode. Although the foregoing description refers to certain exemplary materials for the fabrication of the various layers illustrated in FIG. 12, it will be understood that other materials may also be used, e.g., as described elsewhere in this application.

Figure 12F:
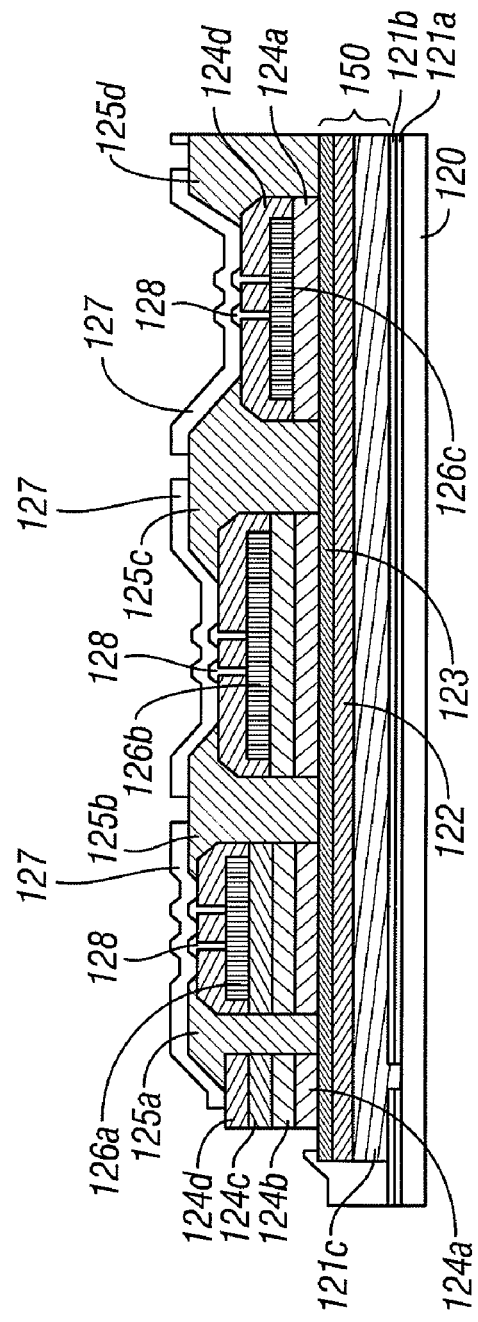

FIG. 12F illustrates an intermediate stage of the fabrication process, wherein the reflective layer 126 has been etched to form mirror portions 126a, 126b, 126c, and an additional layer 124d of sacrificial material has been deposited above the mirror portions 126a, 126b, 126c. The mirror portions 126a, 126b, 126c are preferably formed of a specular metal such as Al, Au, Ag, or an alloy of the foregoing. In certain embodiments where the MEMS device is used as an electromechanical capacitive switch, the mirror portions 126a, 126b, 126c may be formed of a conductor such as Cu, Pt, Ni, Au, Al, or an alloy of the foregoing. Pockets of sacrificial material 124a, 124b, 124c, 124d exist between and around the optical stack 150 and the mirror portions 126a, 126b, 126c. These pockets are separated by support posts 125a, 125b, 125c, 125d.

In addition, connectors 128 are formed through the additional layer 124d of sacrificial material. In one embodiment, the connectors 128 may be simultaneously formed with the support posts 125a, 125b, 125c, 125d. In other embodiments, the connectors 128 may be formed prior to or subsequent to forming the support posts 125a, 125b, 125c, 125d.

Subsequently, a mechanical layer 127 is formed over the support posts 125a, 125b, 125c, 125d, the connectors 128, and the additional layer 124d of sacrificial material. The mechanical layer is preferably formed of nickel. FIG. 12F illustrates a patterned mechanical layer 127 which forms multiple column electrodes. In certain embodiments, the mechanical layer 127 is patterned along with the columns to provide through-holes (not shown). The patterning process can include either a wet or dry etch process. The holes serve to permit etchant to enter and etch by-product to exit at a release step which will be described below. In addition, the holes provide an exit for air when the mechanical layer 127 moves between the relaxed and actuated positions. FIG. 12F illustrates a cross-section of completed "unreleased" interferometric modulators with the sacrificial layers in place.

FIG. 12G illustrates removing the sacrificial layers 124a, 124b, 124c, 124d to form the cavities 129a, 129b, 129c, thereby exposing the second etch stop layer 123 underlying the mirror portions 126a, 126b, 126c. In the illustrated embodiment, gaseous or vaporous $XeF_2$ is used as an etchant to remove the molybdenum sacrificial layers 124a, 124b, 124c, 124d. It will be understood that $XeF_2$ may serve as a source of fluorine-containing gases, and $F_2$ or HF (or other fluorine sources) may be used in place of or in addition to $XeF_2$ as an etchant for the preferred sacrificial materials.

The exposed portions 123 of the second etch stop layer 123 and the sacrificial layers 124a, 124b, 124c, 124d will typically be at least partially removed by the release etch. For example, a very thin $SiO_2$ etch stop layer such as 123 may be removed by a $XeF_2$ etchant used to remove a molybdenum sacrificial layer. The same is true of silicon nitride, titanium, and amorphous silicon. Typically, all of the second etch stop layer 123 is removed from over the first etch stop layer 122 in the cavity regions 129a, 129b, 129c, as shown in FIG. 12H. The second etch stop layer 123 located outside of the cavities, underneath the support posts 125a, 125b, 125c, 125d has not been removed by the etch, as can be seen in FIG. 12H. However, some of the second etch stop layer 123 may remain even in the cavity areas after the release etching process (not shown in FIG. 12H). Any remaining second etch stop layer 123 is transparent and so thin as to not affect optical properties of the device. Additionally, any remaining second etch stop layer 123 will typically have a non-uniform thickness, due to differential exposure to the etchants during removal of differential thicknesses of sacrificial material. In a further embodiment, a second etchant is used to remove the second etch stop layer 123.

A comparison of FIGS. 12H and 12E illustrates that the size of the red pixel cavity 129a (FIG. 12H) corresponds to the combined thicknesses of the three sacrificial layers 124a, 124b, 124c. Likewise, the size of the green pixel cavity 129b corresponds to the combined thicknesses of the two sacrificial layers 124b, 124c, and the size of the blue pixel cavity 129c corresponds to the thickness of the third sacrificial layer 124c. Thus, the dimensions of the cavities 129a, 129b, 129c vary according to the various combined thicknesses of the three layers 124a, 124b, 124c, resulting in an array of interferometric modulators 200, 210, 220 capable of displaying three different colors such as red, green and blue. In certain embodiments, additional etch stops may be interposed between two of the sacrificial layers 124a, 124b, 124c.

As discussed above, portions of the second etch stop layer 123 will be exposed to a greater amount of etchant than other portions of the second etch stop layer 123. This is due to the repeated deposition and etching of bulk sacrificial layer, as discussed above and depicted in FIGS. 12A-12E. While the etchant used in the pattern etching of sacrificial layers 124a and 124b is preferably selected to have as minimal an effect as possible on the second etch stop layer 123, the etchant may have some undesirable effects on the layer 123. Thus, by the stage of the process depicted in FIG. 12G, immediately prior to removal of the bulk sacrificial material through an etching process, the second etch stop layer 123 may have varying properties or height in different locations as a result of variations in etchant exposure. However, because the second etch stop layer 123 is thin and transparent or completely removed from the cavities during the subsequent release etch, these variations will have a minimal effect on the optical or electromechanical behavior of the finished MEMS device. Because of the protection provided by this second etch stop layer 123, the first etch stop layer 122 formed of $AlF_3$, which in certain embodiments is intended to form a part of the finished MEMS device, will be exposed to only a single etching process (the release etch), which typically is highly selective and will not attack $AlF_3$, and variations in the properties of layer 122 can be minimized.

Importantly, the first etch stop layer 122 protects the underlying dielectric (e.g., $SiO_2$) or charge trapping layer (e.g., $Si_3N_4$) during the release etch. The release etch is a prolonged and harmful etch, whose by-products take a long time to diffuse out of the cavities 129a, 129b, 129c. Accordingly, underlying functional layers in the optical stack 150 are protected by the $AlF_3$ etch stop layer 122.

It should be noted that advantages of the embodiments described above are applicable to an interferometric modulator structure viewed from the opposite side, compared to that shown in FIG. 1. Such a configuration has a reflective electrode closer to the substrate (which need not be transparent) and a semitransparent electrode farther from the substrate. Either or both electrodes could be made movable. In addition, although not shown, it should be noted that the embodiments of FIGS. 8-12 may be combined with options of the embodiments described above with reference to FIGS. 1-7.

The above-described modifications can lead to a more robust design and fabrication. Additionally, while the above aspects have been described in terms of selected embodiments of the interferometric modulator, one of skill in the art will appreciate that many different embodiments of interferometric modulators may benefit from the above aspects. Of course, as will be appreciated by one of skill in the art, additional alternative embodiments of the interferometric modulator can also be employed. The various layers of interferometric modulators can be made from a wide variety of conductive and non-conductive materials that are generally well known in the art of semi-conductor and electro-mechanical device fabrication.

In addition, the embodiments, although described with respect to an interferometric modulator, are applicable more generally to other MEMS devices, particularly electrostatic MEMS with electrodes capable of relative movement, and the described $AlF_3$ layers can minimize stiction between the electrodes in an actuated or collapsed position.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

I claim:

1. An interferometric modulator, comprising:
a first electrode having a first surface; and
a second electrode having a second surface facing the first surface and defining a gap therebetween, the second electrode movable in the gap between a first position and a second position, the first position being a first distance from the first electrode, the second position being a second distance from the first electrode, the second distance being greater than the first distance,
wherein at least one of the electrodes comprises an aluminum fluoride layer facing the other of the electrodes,
wherein the aluminum fluoride layer is resistant to a fluorine-based etchant.

2. An interferometric modulator, comprising:
a first electrode having a first surface; and
a second electrode having a second surface facing the first surface and defining a gap therebetween, the second electrode movable in the gap between a first position and a second position, the first position being a first distance from the first electrode, the second position being a second distance from the first electrode, the second distance being greater than the first distance,
wherein at least one of the electrodes comprises an aluminum fluoride layer facing the other of the electrodes,
wherein the aluminum fluoride layer reduces stiction between the electrodes during operation relative to when the electrodes do not comprise the aluminum fluoride layer.

3. An interferometric modulator, comprising:
a first electrode having a first surface; and
a second electrode having a second surface facing the first surface and defining a gap therebetween, the second electrode movable in the gap between a first position and a second position, the first position being a first distance from the first electrode, the second position being a second distance from the first electrode, the second distance being greater than the first distance,
wherein at least one of the electrodes comprises an aluminum fluoride layer facing the other of the electrodes,
wherein the aluminum fluoride layer has a thickness between about 50 Å and about 200 Å.

4. The interferometric modulator of claim 3, wherein the aluminum fluoride layer comprises aluminum trifluoride ($AlF_3$).

5. The interferometric modulator of claim 3, wherein the aluminum fluoride layer has a thickness between about 70 Å and about 150 Å.

6. The interferometric modulator of claim 4, wherein the first electrode comprises the aluminum fluoride layer.

7. The interferometric modulator of claim 6, wherein the first electrode further comprises a conductive layer.

8. The interferometric modulator of claim 7, wherein the first electrode further comprises an absorber layer between the conductive layer and the aluminum fluoride layer.

9. The interferometric modulator of claim 8, wherein the first electrode further comprises a dielectric layer between the absorber layer and the aluminum fluoride layer.

10. The interferometric modulator of claim 6, further comprising an etch stop layer on a surface of the aluminum fluoride layer, the etch stop layer being exposed to the gap, the etch stop layer comprising at least one material selected from the group consisting of silicon oxide, silicon nitride, molybdenum, titanium, and amorphous silicon.

11. The interferometric modulator of claim 10, wherein the etch stop layer has a varying thickness over the surface of the aluminum fluoride layer.

12. The interferometric modulator of claim 10, wherein the etch stop layer covers only a portion of the aluminum fluoride layer.

13. An interferometric modulator, comprising:
a first electrode having a first surface; and
a second electrode having a second surface facing the first surface and defining a gap therebetween, the second electrode movable in the gap between a first position and a second position, the first position being a first distance from the first electrode, the second position being a second distance from the first electrode, the second distance being greater than the first distance;
a display;
a processor that is in electrical communication with the display, the processor being configured to process image data; and
a memory device in electrical communication with the processor,
wherein at least one of the electrodes comprises an aluminum fluoride layer facing the other of the electrodes.

14. The interferometric modulator of claim 13, further comprising:
a first controller configured to send at least one signal to the display; and
a second controller configured to send at least a portion of the image data to the first controller.

15. The interferometric modulator of claim 13, further comprising:
an image source module configured to send the image data to the processor.

16. The interferometric modulator of claim 13, further comprising:
an input device configured to receive input data and to communicate the input data to the processor.

17. An interferometric modulator, comprising:
transmissive means for at least partially transmitting incident light, the transmissive means having a first surface;
reflective means for substantially reflecting incident light, the reflective means having a second surface facing the first surface; and
moving means for moving the reflective means relative to the transmissive means between a driven position and an undriven position, the driven position being closer to the transmissive means than is the undriven position,
wherein at least one of the transmissive and reflective means comprises a layer formed of aluminum fluoride, the layer facing the other of the transmissive and reflective means.

18. The interferometric modulator of claim 17, wherein the means for moving comprises a deformable layer.

19. A method of making an interferometric modulator, comprising:
forming a lower electrode;
forming a sacrificial layer over the lower electrode;
forming an upper electrode; and
forming an aluminum fluoride layer between forming the lower electrode and forming the upper electrode, wherein the aluminum fluoride layer has a thickness of less than about 200 Å.

20. The method of claim 19, wherein forming the aluminum fluoride layer comprises forming the aluminum fluoride layer prior to forming the sacrificial layer.

21. The method of claim 20, further comprising forming an etch stop layer after forming the aluminum fluoride layer and prior to forming the sacrificial layer, wherein the etch stop layer comprises at least one material selected from the group consisting of silicon oxide, silicon nitride, molybdenum, titanium, and amorphous silicon.

22. The method of claim 21, wherein forming the sacrificial layer comprises:
   forming a first sacrificial layer over the etch stop layer;
   removing a portion of the first sacrificial layer after forming the first sacrificial layer, thereby exposing a portion of the etch stop layer; and
   forming a second sacrificial layer over a remaining portion of the first sacrificial layer and an exposed portion of the etch stop layer after removing the portion of the first sacrificial layer.

23. The method of claim 22, wherein forming the sacrificial layer further comprises, after forming the second sacrificial layer:
   removing a portion of the second sacrificial layer, thereby exposing a portion of the etch stop layer; and
   forming a third sacrificial layer over a remaining portion of the second sacrificial layer and an exposed portion of the etch stop layer after removing the portion of the second sacrificial layer.

24. The method of claim 19, wherein forming the aluminum fluoride layer comprises forming the aluminum fluoride layer after forming the sacrificial layer.

25. The method of claim 19, wherein forming the aluminum fluoride layer comprises forming an aluminum fluoride layer prior to forming the sacrificial layer and another aluminum fluoride layer after forming the sacrificial layer.

26. The method of claim 19, further comprising removing the sacrificial layer, wherein the aluminum fluoride layer serves as an etch stop during removing the sacrificial layer.

27. The method of claim 26, wherein removing the sacrificial layer comprises using xenon difluoride ($XeF_2$).

28. The method of claim 26, wherein the sacrificial layer is formed of a material selected from the group consisting of molybdenum, silicon, and tungsten.

29. The method of claim 19, wherein forming the aluminum fluoride layer comprises using a physical vapor deposition (PVD) process.

30. The method of claim 29, wherein the PVD process comprises sputtering a target comprising aluminum fluoride.

31. The method of claim 19, wherein forming the lower electrode further comprises providing a dielectric layer over a conductive layer.

32. The method of claim 19, wherein the lower electrode comprises a transparent electrode, and wherein the upper electrode comprises a reflective electrode.

33. A interferometric modulator manufactured using the method of claim 19.

34. The interferometric modulator of claim 17, wherein the layer formed of aluminum fluoride is resistant to a fluorine-based etchant.

35. The interferometric modulator of claim 17, wherein the layer formed of aluminum fluoride comprises aluminum trifluoride ($AlF_3$).

36. The interferometric modulator of claim 17, wherein the layer formed of aluminum fluoride has a thickness between about 50 Å and about 200 Å.

37. The interferometric modulator of claim 17, wherein the transmissive means comprises the layer formed of aluminum fluoride.

38. The interferometric modulator of claim 17, wherein the reflective means comprises the layer formed of aluminum fluoride.

39. The interferometric modulator of claim 17, wherein the transmissive means comprises a conductive layer and an absorber layer.

40. The interferometric modulator of claim 17, wherein the reflective means comprises a reflective layer and a mechanical layer.

* * * * *